United States Patent
Connor et al.

(10) Patent No.: US 7,368,483 B2
(45) Date of Patent: May 6, 2008

(54) POROUS COMPOSITION OF MATTER, AND METHOD OF MAKING SAME

(75) Inventors: Eric Connor, Los Gatos, CA (US); James P. Godschalx, Midland, MI (US); Craig J. Hawker, Los Gatos, CA (US); James L. Hedrick, Pleasanton, CA (US); Victor Yee-Way Lee, San Jose, CA (US); Teddie P. Magbitang, San Jose, CA (US); Robert D. Miller, San Jose, CA (US); Q. Jason Niu, Midland, MI (US); Willi Volksen, San Jose, CA (US)

(73) Assignees: International Business Machines Corporation, Armonk, NY (US); Dow Global Technologies, Inc., Midland, MI (US)

( * ) Notice: Subject to any disclaimer, the term of this patent is extended or adjusted under 35 U.S.C. 154(b) by 234 days.

(21) Appl. No.: 10/827,694

(22) Filed: Apr. 19, 2004

(65) Prior Publication Data

US 2004/0198850 A1    Oct. 7, 2004

Related U.S. Application Data

(63) Continuation-in-part of application No. 10/334,438, filed on Dec. 31, 2002, now abandoned.

(51) Int. Cl.
*C08J 9/02* (2006.01)
*C08L 83/02* (2006.01)

(52) U.S. Cl. .............................. 521/77; 521/90; 521/98; 521/134; 521/138; 521/139; 526/281; 526/285

(58) Field of Classification Search ................ 521/77, 521/134, 138, 39, 90, 98, 139; 526/285, 526/281
See application file for complete search history.

(56) References Cited

U.S. PATENT DOCUMENTS

| | | | |
|---|---|---|---|
| 4,587,315 | A | 5/1986 | Lau |
| 5,268,444 | A | 12/1993 | Jensen et al. |
| 5,312,994 | A | 5/1994 | Bryant et al. |
| 5,426,234 | A | 6/1995 | Bryant et al. |
| 5,446,204 | A | 8/1995 | Bryant et al. |
| 5,493,002 | A | 2/1996 | McGrath et al. |
| 6,093,636 | A | 7/2000 | Carter et al. |
| 6,121,495 | A | 9/2000 | Babb et al. |
| 6,252,001 | B1 | 6/2001 | Babb et al. |
| 6,265,753 | B1 | 7/2001 | Carter et al. |
| 6,288,188 | B1 | 9/2001 | Godschalx et al. |
| 6,359,091 | B1 | 3/2002 | Godschalx et al. |
| 6,423,811 | B1 | 7/2002 | Lau et al. |
| 6,468,589 | B2 | 10/2002 | Nishikawa et al. |
| 2002/0037941 | A1* | 3/2002 | Lau et al. ..................... 521/77 |

FOREIGN PATENT DOCUMENTS

WO    WO/98/11149    3/1998

OTHER PUBLICATIONS

N. Miyaura, et al. (1995) "Palladium-Catalyzed Cross-Coupling Reactions of Organoboron compounds" Chem. Rev., vol. 95, No. 7, pp. 2457-2483.

* cited by examiner

*Primary Examiner*—Irina S Zemel
(74) *Attorney, Agent, or Firm*—Scully, Scott, Murphy & Presser

(57) ABSTRACT

A low-k organic dielectric material having stable nano-sized porous is provided as well as a method of fabricating the same. The porous low-k organic dielectric material is made from a composition of matter having a vitrification temperature (Tv-comp) which includes a b-staged thermosetting resin having a vitrification temperate (Tv-resin), a pore generating material, and a reactive additive. The reactive additive lowers Tv-comp below Tv-resin.

30 Claims, 13 Drawing Sheets

POROUS COMPOSITION OF MATTER, AND METHOD OF MAKING SAME

This application is a continuation-in-part of, and claims priority to, U.S. application Ser. No. 10/334,438, filed Dec. 31, 2002 now abandoned, which is hereby incorporated by reference in its entirety.

RELATED APPLICATION

This application is related to co-assigned U.S. application Ser. No. 10/334,413, which was filed concurrently with U.S. application Ser. No. 10/334,438.

The U.S. Government has a paid-up license in this invention and the right in limited circumstances to require the patent owner to license others on reasonable terms as provided for by the terms of Cooperative Agreement No. 70NANB8H4013 awarded by NIST (Advanced Technology Program).

This invention was made with the U.S. Government support under the above-referenced Cooperative Agreement awarded by NIST. The U.S. Government has certain rights in this invention.

FIELD OF THE INVENTION

The present invention relates to compositions of matter that can be employed as a low dielectric constant (low-k) insulating layer in various microelectronic devices, and more particularly to porous low-k dielectric compositions. The present invention also relates to a method of introducing stable nano-sized pores into thermosetting resins by using a porogen and a reactive additive.

BACKGROUND OF THE INVENTION

The semiconductor industry's drive to continually improve performance and density has forced the use of advanced materials and interconnect structures. High interconnect performance requires the reduction of resistance and capacitance. Copper metallization was introduced in 1998 to reduce the resistance of interconnect wiring. Capacitance reduction or the introduction of low dielectric constant insulators, herein referred to as low-k dielectrics, are needed for future performance enhancements.

For over 25 years, silicon dioxide has been the dielectric insulator of choice for the semiconductor industry. Silicon dioxide possesses excellent dielectric breakdown strength, a high modulus, good thermal conductivity, a low coefficient of thermal expansion, and excellent adhesion to metallic liners, plasma enhanced chemical vapor deposited (PECVD) barrier cap layers, and other like materials. However, with reduced ground rule dimensions and the need for improved performance, silicon dioxide is slowly being phased out and replaced with materials possessing lower permitivity to achieve reduced capacitance. For example, at the 180 nm technology node, fluorosilicate glass is replacing silicon dioxide in many applications.

At the 130 nm technology generation, "true" low-k dielectrics are being implemented into semiconductor products. There are several candidate materials but the industry has focused primarily on two material classes: spin-on polymers and carbon-doped PECVD silicon dioxide dielectrics.

Polymer dielectrics may be used as insulating layers between various circuits as well as layers within circuits in microelectronic devices, such as integrated circuits, multichip modules, and laminated circuit boards. The microelectronics fabrication industry is moving toward smaller geometries in its devices to enable lower power and faster speeds. As the conductor lines become finer and more closely packed, the requirements of the dielectrics between such conductors become more stringent.

While polymer dielectrics often provide lower dielectric constants than inorganic dielectrics, such as silicon dioxide, polymer dielectrics often present challenges to process integration during fabrication. For example, to replace silicon dioxide as a dielectric in integrated circuits, the polymer dielectric must be able to withstand processing temperatures during metallization and annealing steps of the process. Preferably, the dielectric material should have a glass transition temperature greater than the processing temperature. The dielectric must also retain the desirable properties under device use conditions. For example, the dielectric should not absorb water which may cause an increase in the dielectric constant and dielectric loss and which may potentially lead to corrosion of metal conductors.

Porous thermoplastic polymers, particularly thermally stable polymers, such as polyimides, have also been investigated for use as low-k alternatives to silicon dioxide. Although such porous thermoplastic materials can be made to have acceptable dielectric constants and are relatively tough, being able to withstand the mechanical processing steps necessary to fabricate microelectronic devices, the pores tend to collapse during subsequent high temperature processing thereby precluding porous thermoplastic polymers for applications of interest.

Another class of low-k polymers that are attracting considerable interest in the microelectronics industry is thermosetting resins, particularly polyarylene resins. Such thermosetting resins are disclosed, for example, in WO 98/11149. Specifically, WO 98/11149 discloses dielectric polymers, which are the reaction products of a cyclopentadienone functional compound and an acetylene functional compound.

Although thermosetting resins are available, it has been determined that such resin formulations may suffer from pore collapse when attempting to form a porous structure from the resin by introducing a porogen into the b-staged formulation, thereby rendering such porous thermosetting resins also unsuitable for use in many microelectronic applications.

The prior art literature in this field may be divided into a number of different classes. The first is the formation of bloomers that are functionalized with acetylenic substituents that are capable of inducing chain extension or crosslinking during processing. The crosslinking may be thermal or promoted by a catalyst. These prior art references are characterized by oligomeric materials containing acetylenic substituents bound to the oligomers. The prior art falling into this group include, for example, U.S. Pat. Nos. 4,587,315, 5,493,002, 5,426,234, 5,446,204, 6,265,753, 5,268,444 and 5,312,994.

There are a number of patents such as, for example, U.S. Pat. Nos. 6,288,188, 6,252,001 and 6,121,495, that describe the preparation of b-staged solutions of polyarylenes prepared from different intermediates and subsequent thermosetting after processing. While the matrix materials are similar, the reactive functionality (type and number) is determined by monomer stoichiometry before b-staging.

U.S. Pat. No. 6,093,636 describes the preparation of porous organic thermosets including polyarylene compositions by the thermal labile porogen approach. These porous organic thermosets may suffer from pore collapse.

U.S. Pat. Nos. 5,426,234, 5,446,204, 5,268,444 and 5,312,994 describe the use of various acetylenic reactive diluents which react with functionalized oligomers. In these prior art references the goal was to lower viscosity for polymer melt processing and to increase the crosslinking density after curing. This technique was applied to the formation of dense thermosetting polymers with no mention of porosity.

U.S. Pat. No. 6,359,091 describes a polyarylene composition in which the thermosetting resin does not undergo a significant drop of modulus at temperatures above 300° C. during curing. That feature reportedly enabled one to form porous films by avoiding pore collapse. Specifically, the '091 patent discloses that by modifying the formulations so that the resins do not undergo a significant drop in modulus during cure or alternatively shifting the temperature at which the minimum modulus occurs to a lower temperature enables one to avoid pore collapse. Thus, in the '091 patent the modulus-temperature profile is modified such that the modulus drop of the b-staged resin prior to network formation is minimized. In the '091 patent, a crosslinker is added to a polyarylene oligomer solution.

U.S. Pat. No. 6,468,589 describe a composition for film formation which comprises a poly(arylene ether) polymer having repeating structural units represented by formula (1) mentioned at Col. 2, lines 25-34. The poly(arylene ether) polymer is made by heating a bisphenol compound and a dihalogenated compound in a solvent in the presence of a catalyst such as an alkali metal compound. Crosslinking agents such as actylenes may be present in this prior art composition.

In view of the state of the art mentioned hereinabove, there is still a need for providing thermosetting polymer compositions which are capable of providing a low-k dielectric material having nano-sized pores which are substantially stable and do not collapse during further high temperature processing In the present invention, a low molecular weight compound that plasticizes the resin and acts as a reactive additive is employed in forming thermosetting polymer compositions. During the thermal ramp to the cure temperature, one role of the additive of the present invention is to create a situation where the glass transition temperature of the materials advances to a temperature above the actual cure temperature of the system, i.e., to modify the classical Time Temperature Transformation profile for the thermoset. This aspect of the present invention is not described in any of the above mentioned references. A characteristic of many organic thermosets is that the glass transition temperature of the thermoset closely tracks the cure temperature. In the present application, by using the inventive additive, the applicants have unexpectedly determined that a condition is created where the glass transition temperature of the thermoset increases to a temperature above the cure temperature, provided a threshold temperature is exceeded. This feature is not mentioned in any of the prior art mentioned above.

SUMMARY OF THE INVENTION

The present invention provides a means to introduce pores into a thermosetting resin matrix by the addition of a pore generating material, preferably a polymer, i.e., porogen, that degrades to leave behind its imprint in the resin. For the porogen to leave behind a nanometer sized hole, the polymer matrix must be able to support these small structures at the temperatures required for its removal. Thermal studies of organic thermosetting resins such as polyarylene resins that undergo a substantial degree of crosslinking via acetylene-acetylene reactions have revealed that the vitrification event occurs at temperatures above 400° C. Some porogens, which have tailored architectures, degrade before these matrices are significantly cured. The implication of this is that once the porogen has burned out, the resultant pore may collapse thereby providing a dense dielectric film which is unsuitable in many microelectronic applications.

In an attempt to address this, the applicants of the present invention have carried out a study to make the matrix more rigid (e.g., by increasing the crosslinking density), so as to support small pores. The main focus of this approach was to add a low molecular weight compound that plasticizes the resins and acts as a reactive additive (or diluent). During thermal ramp to cure temperature, one role of the reactive additive is to create a situation where the glass transition temperature (Tg) of the material advances to a temperature above the actual cure temperature of the system, i.e., to alter the classic Time Temperature Transformation (TTT) profile for the thermosetting resin.

A characteristic of many organic thermosetting resins is that the Tg of the thermoset closely tracks the cure temperature, e.g., if a thermosetting resin was heated to 250° C., the Tg of the cured resin would also be near 250° C. In the present invention, the reactive additive (also termed "reactive diluent"), creates a condition where the Tg of the thermoset increases to a temperature above the cure temperature, provided a threshold temperature is exceeded.

Specifically, the present invention provides a composition of matter having a vitrification temperature (Tv-comp) comprising a b-staged thermosetting resin having a vitrification temperature (Tv-resin); a pore generating material; and a reactive additive that is capable of lowering the Tv-comp below that of the Tv-resin.

The term "thermosetting resin" denotes any polymer resin which does not melt when heated but, at sufficiently high temperatures, decomposes irreversibly. The thermosetting resins are substantially crosslinked materials consisting generally of an extensive three-dimensional network of covalent chemical bonding.

The term "vitrification temperature" denotes the onset temperature in a particular thermosetting polymer where the viscosity begins to increase significantly. The term "vitrification temperature" may be interchangeably used with the term "onset of cure".

The term "b-staged thermosetting resin" denotes a stage of forming a thermosetting resin wherein at least two monomers react to provide a matrix material having an advanced molecular weight wherein substantially no gelling occurs.

The reactive additive employed in the present invention may also serve as a compatiblizer between the b-staged matrix material and the pore generating material causing phase separation to be delayed in nucleation and growth systems, while preventing agglomeration in particle template approaches. The reactive additive employed in the present invention also lowers the vitrification temperature of the resin matrix such that vitrification may occur below the thermal decomposition temperature of the pore generating material. Finally, the reactive additive of the present invention reacts to modify the matrix, allowing it to resist pore collapse upon decomposition of the pore generating material.

Specifically, the reactive additives employed in the present invention are acetylene based monomers that soften or melt below a certain temperature, and when a critical temperature is reached the reactive additive reacts with the b-staged thermosetting resin to form a rigid networked polymer.

The present invention also provides a method of forming a porous, low-k dielectric material. Specifically, a preferred method of the present invention includes: applying a composition of matter having a vitrification temperature (Tv-comp) onto a surface of substrate, said composition of matter comprising a b-staged thermosetting resin having a vitrification temperature (Tv-resin), a pore generating material, and a reactive additive that is selected to lower the Tv-comp below that of the Tv-resin; heating the composition of matter to vitrification; and decomposing, via thermal treatment or radiation, the pore generating material providing a porous layer of cured material on the surface of the substrate.

DETAILED DESCRIPTION OF THE INVENTION

Figure 1:
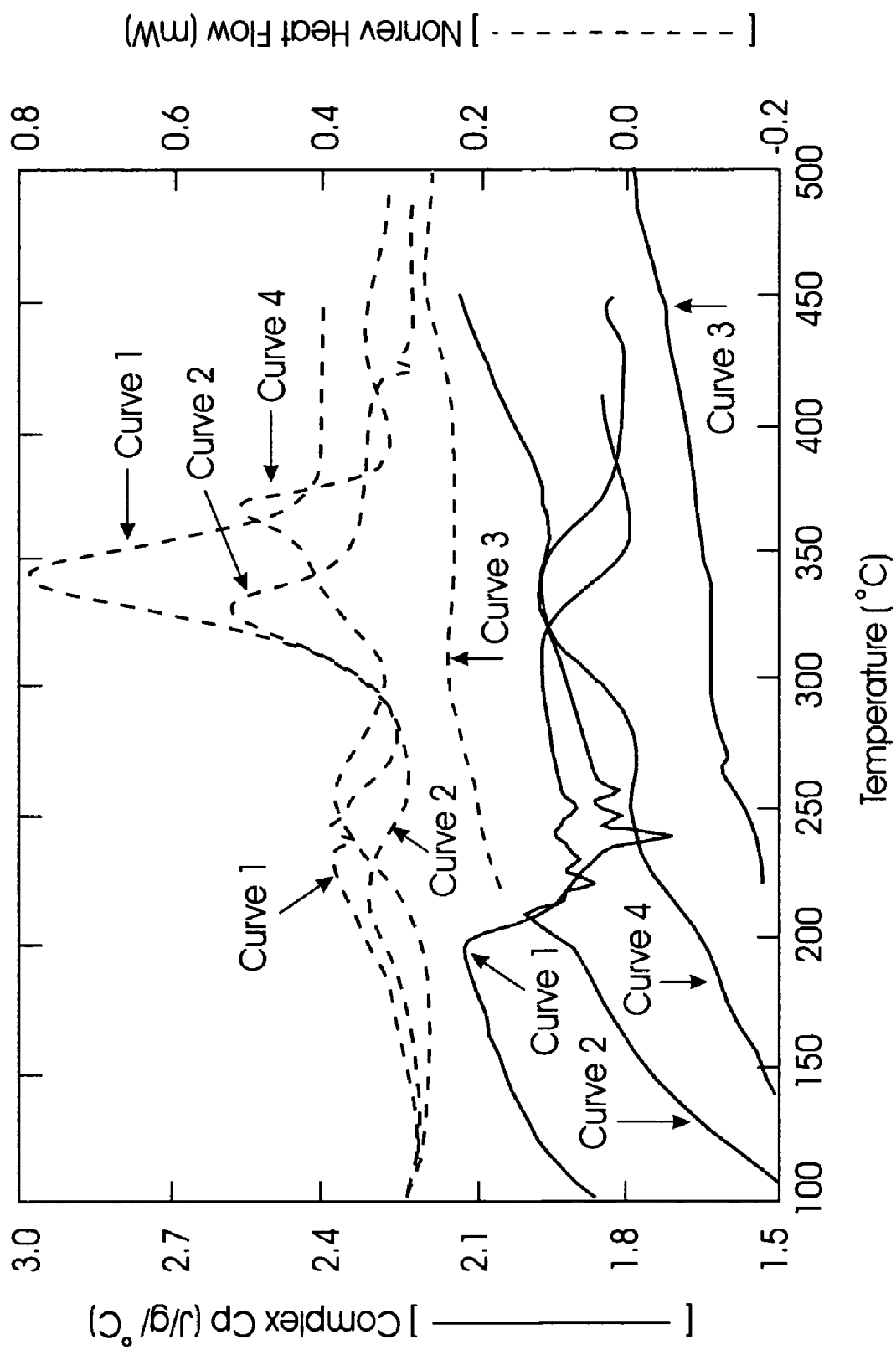
FIG. 1 is a modulated DSC (Differential Scanning Calorimetry) curve for a polyarylene resin with additives.

As stated above, the present invention provides a composition of matter that is capable of forming a low-k dielectric material having stable nano-sized pores within the dielectric material. The composition of matter of the present invention includes a b-staged thermosetting resin having a vitrification temperature (Tv-resin); a pore generating material; and a reactive additive. The reactive additive employed in the present invention is selected so as to lower the vitrification temperature of the composition below that of Tv-resin.

In the present invention, Tv-resin is from about 200° C. to about 450° C., while Tv-comp is from about 180° C. to about 400° C. Moreover preferably, Tv-resin is from about 200° C. to about 400° C., while Tv-comp is from about 160° C. to about 350° C., even more preferably, Tv-resin is from about 200° C. to about 350° C., while Tv-comp is from about 160° C. to about 350° C.

Based on 100 percent dry weight of the total composition, the composition of matter comprises from about 20 to about 91 weight percent of b-staged thermosetting resin, from about 5 to about 50 weight percent of pore generating material, and from about 4 to about 60 weight percent of reactive additive. More preferably, the composition of matter of the present invention comprises from about 30 to about 75 weight percent of b-staged thermosetting resin, from about 10 to about 40 weight percent of pore generating material, and from about 4 to about 50 weight percent of reactive additive. Most preferably, the composition of matter of the present invention comprises from about 60 to about 70 weight percent of b-staged thermosetting resin, from about 25 to about 35 weight percent of pore generating material, and from about 4 to about 30 weight percent of reactive additive.

The b-staged thermosetting resins employed in the present invention contain functionality that is reactive with the reactive additive. A preferred thermosetting resin is a polyarylene resin. The term "polyarylene" is used herein to denote aryl moieties or inertly substituted aryl moieties which are linked together by bonds, fused rings, or inert linking groups such as oxygen, sulfur, sulfone, sulfoxide, carbonyl, etc. The precursor composition may comprise monomers, oligomers, or mixtures thereof. Preferably, the precursor composition comprises cyclopentadienone functional groups and acetylene functional aromatic compounds and/or partially polymerized reaction products of such compounds.

The most preferred precursor compositions that can be employed in the present invention comprise the following monomers and/or partially polymerized reaction products of the following monomers:

a biscyclopentadienone of the formula:

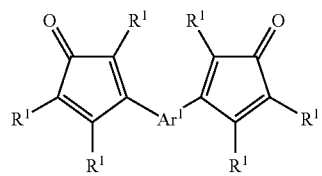

(b) a polyfunctional acetylene of the formula:

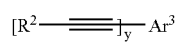

(c) and, optionally, a diacetylene of the formula:

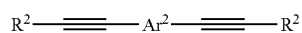

wherein $R^1$ and $R^2$ are independently H or an unsubstituted or inertly-substituted aromatic moiety and $Ar^1$, $Ar^2$ and $Ar^3$ are independently an unsubstituted aromatic moiety, or inertly-substituted aromatic moiety, and y is an integer of three or more. Stated alternatively, the most preferred precursor material comprises a curable polymer of the formula:

wherein A has the structure:

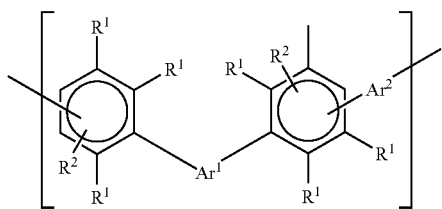

and B has the structure:

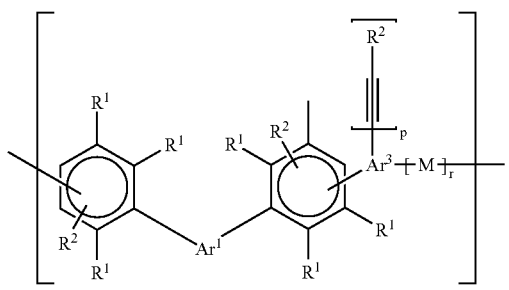

endgroups EG are independently represented by any one of the formulas:

EG=

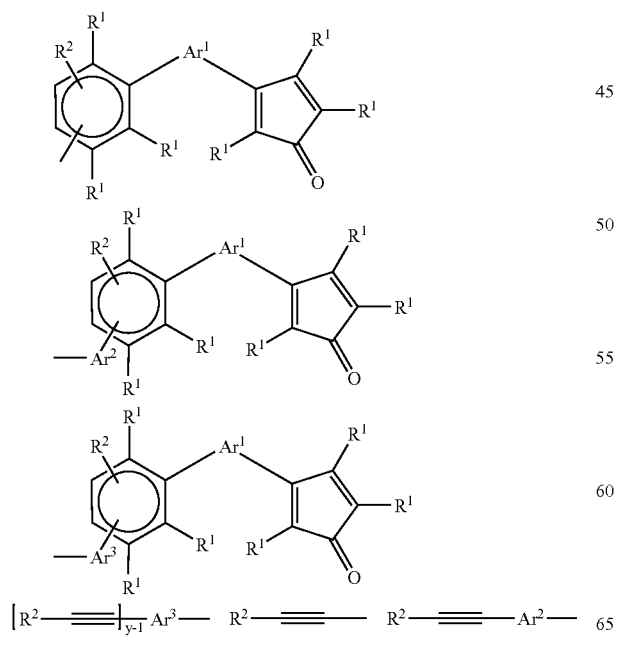

wherein $R^1$ and $R^2$ are independently H or an unsubstituted or inertly-substituted aromatic moiety and $Ar^1$, $Ar^2$ and $Ar^3$ are independently an unsubstituted aromatic moiety or inertly-unsubstituted aromatic moiety and M is a bond, y is an integer of three or more, p is the number of unreacted acetylene groups in the given mer unit, r is one less than the number of reacted acetylene groups in the given mer unit and p+r=y−1, z is an integer from 1 to about 1000; w is an integer from 0 to about 1000 and v is an integer of two or more.

The definition of aromatic moiety includes phenyl, polyaromatic and fused aromatic moieties. Inertly-substituted means the substituent groups are essentially inert to the cyclopentadienone and acetylene polymerization reactions and do not readily react under the conditions of use of the cured polymer in microelectronic devices with environmental species such as water. Such substituent groups include, for example, F, Cl, Br, —$CF_3$, —$OCH_3$, —$OCF_3$, —O—Ph and alkyl of from one to eight carbon atoms, cycloalkyl of from three to about eight carbon atoms. For example, the moieties which can be unsubstituted or inertly-substituted aromatic moieties include:

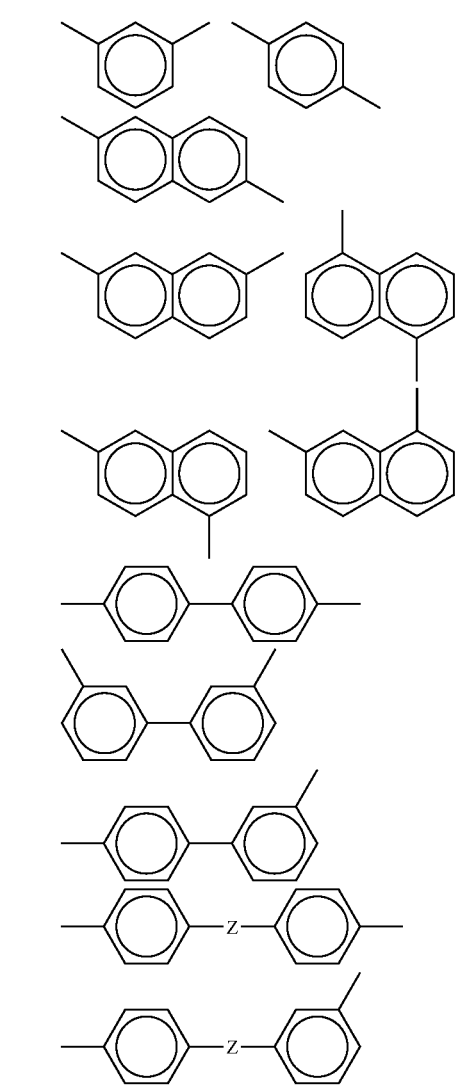

-continued

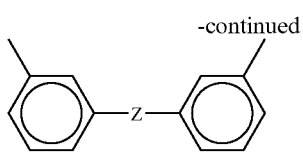

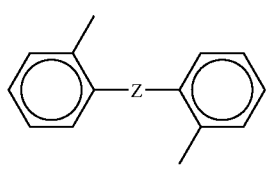

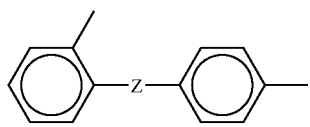

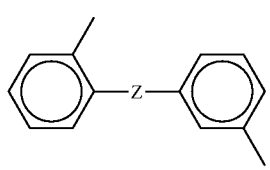

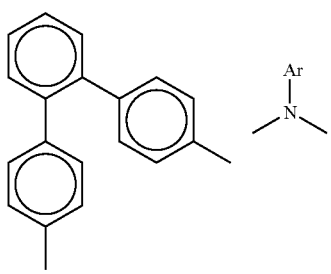

wherein Ar is an aromatic moiety as defined above and Z can be: —O—, —S—, alkylene, —CF$_2$—, —CH$_2$—, —O—CH$_2$—, perfluoroalkyl, perfluoroalkoxy,

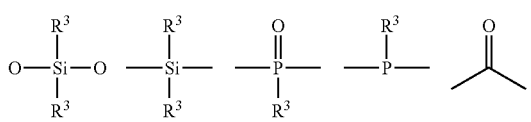

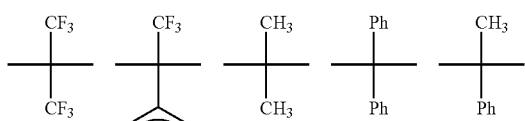

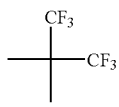

wherein each R$^3$ is independently —H, —CH$_3$, —CH$_2$CH$_3$, —(CH$_2$)$_2$CH$_3$ or Ph (phenyl). A highly preferred thermosetting resin employed in the present invention is a polyarylene resin sold under the tradename SiLK® by the Dow Chemical Co. which is the resultant cured b-staged Diels Alder reaction product of a biscyclopentadienone and a polyfunctional acetylene. Commercially available examples of some other preferred polyarylene resins include SiLK®-H, and SiLK®-I dielectric resins from the Dow Chemical Company.

The reactive additive that is employed in the present invention includes functionality that may become chemically incorporated into the resin upon vitrification. Hence, the reactive additive produces a structure that has sufficient mechanical strength to withstand capillary collapsing forces produced upon porogen decomposition. Moreover, the reactive additive employed in the present invention may increase the solubility of the porogen in the resin. Additionally, the reactive additive employed in the present invention is capable of plasticizing the resin, thereby lowering the glass transition temperature of the composition and allowing vitrification to proceed at lower temperatures. Furthermore, the reactive additive employed in the present invention allows, during curing of the composition of matter, the glass transition temperature of the matter to advance above the curing temperature.

Specifically, the reactive additive employed in the present invention is an acetylene based monomer that softens or melts above a certain temperature and when a critical temperature is reached the monomer reacts with the resin composition to form a rigid networked polymer. The acetylene based monomers that can be employed in the present invention are selected from one of the following compounds:

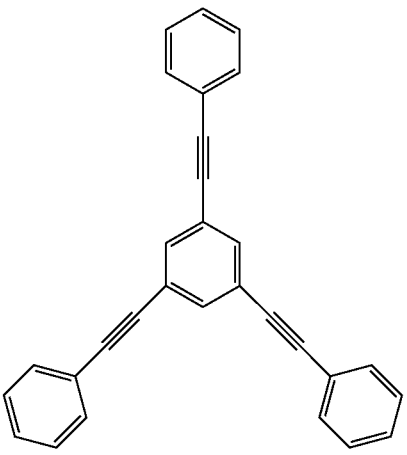

Tris A

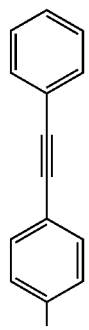

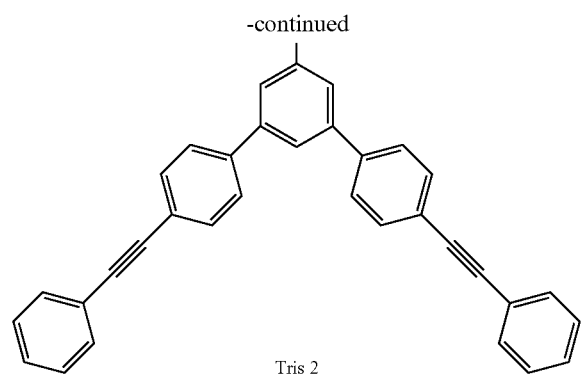
Tris 2
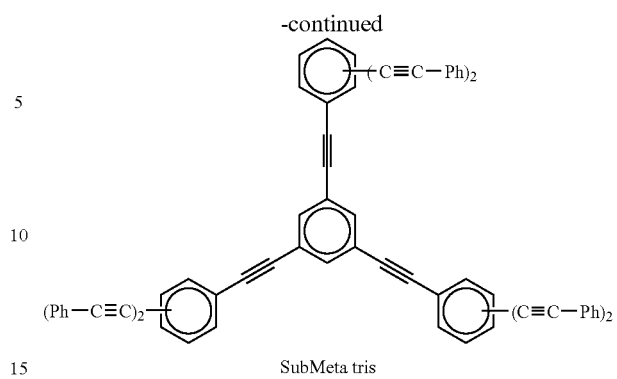
SubMeta tris
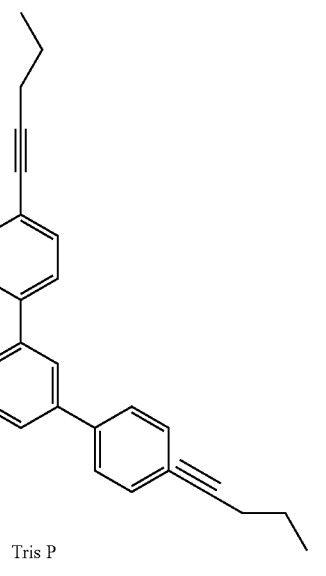
Tris P
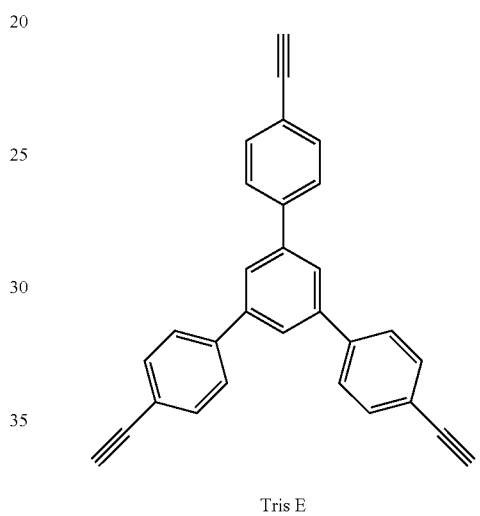
Tris E
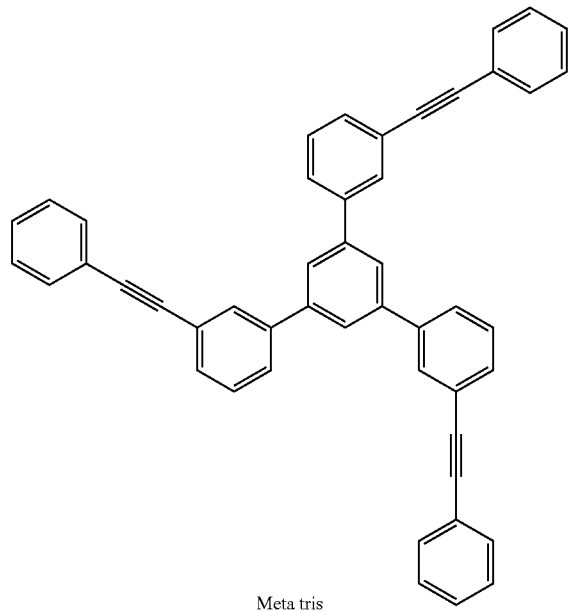
Meta tris
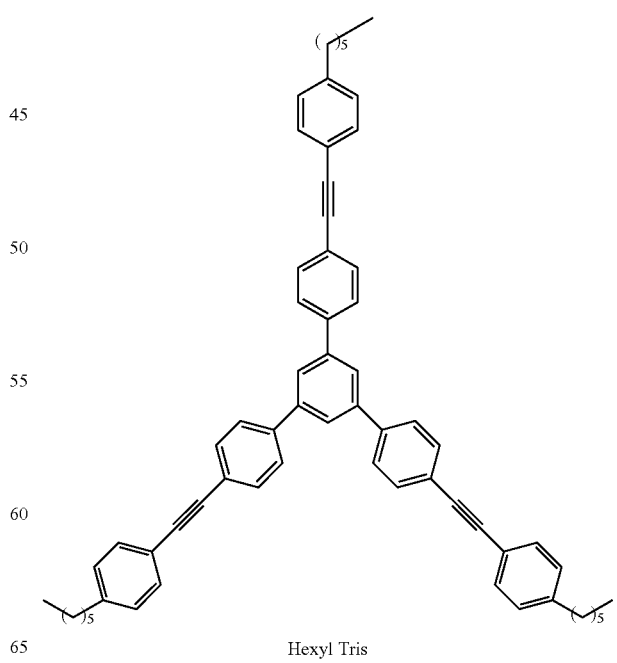
Hexyl Tris As is illustrated within the context of the foregoing chemical structures, each of the foregoing acetylene based monomers implicitly derives from a general class of tri-acetylene monomers that includes a centrally located uniformly 1,3,5-trisubstituted phenyl moiety.

Of these acetylene based monomers, TRIS A, TRIS 2 and TRIS P are highly preferred. The acetylene based monomers can be prepared using techniques that are well known to those skilled in the art. See, for example, N. Miyaura and A. Suzuki, Chem. Rev., 1995, vol. 95, p. 2457.

The following reaction scheme illustrates the general synthesis of Tris 2, Tris E, hexyl Tris starting from a para-substituted benzyl ring that may be employed.

General sythesis:

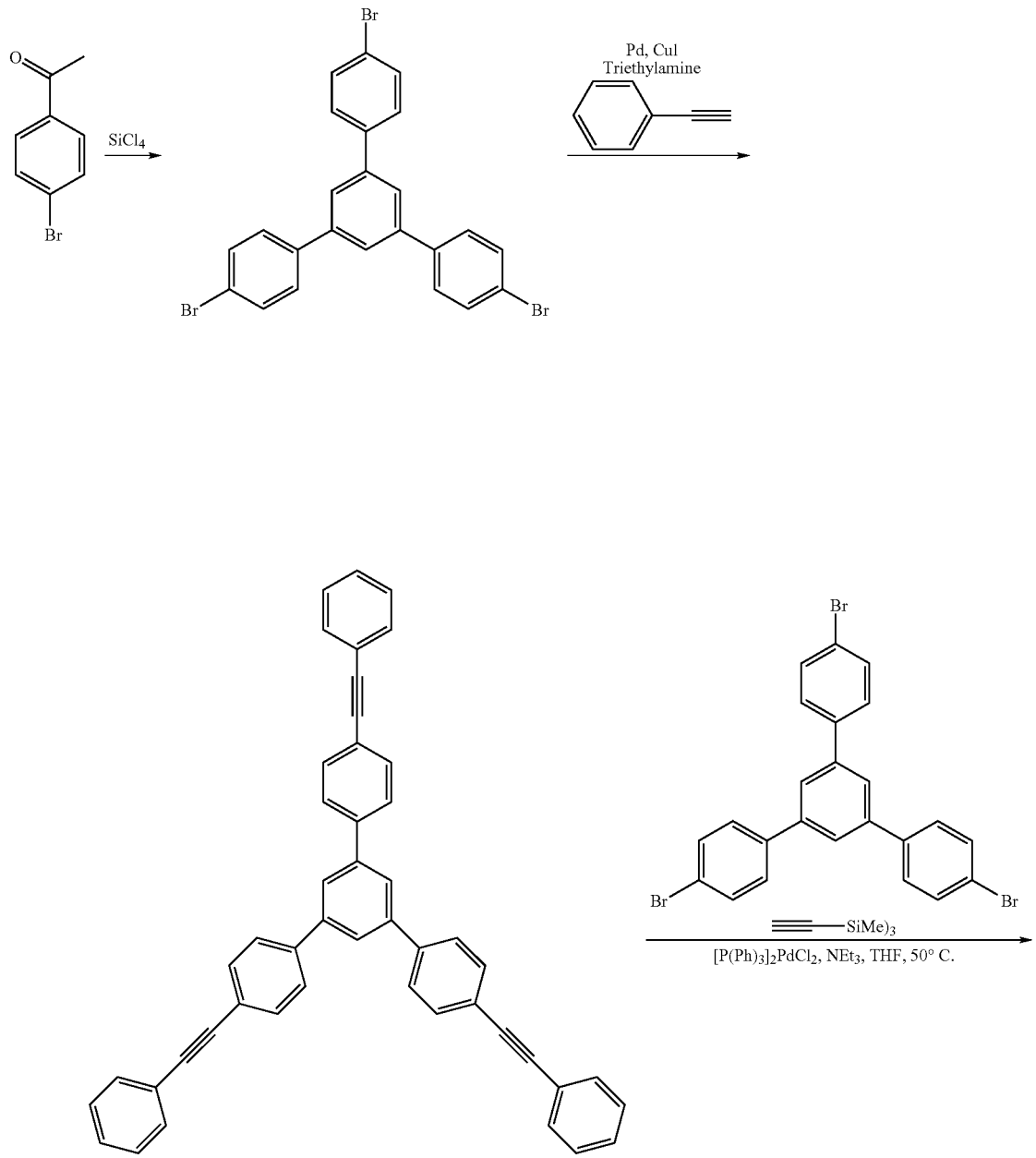

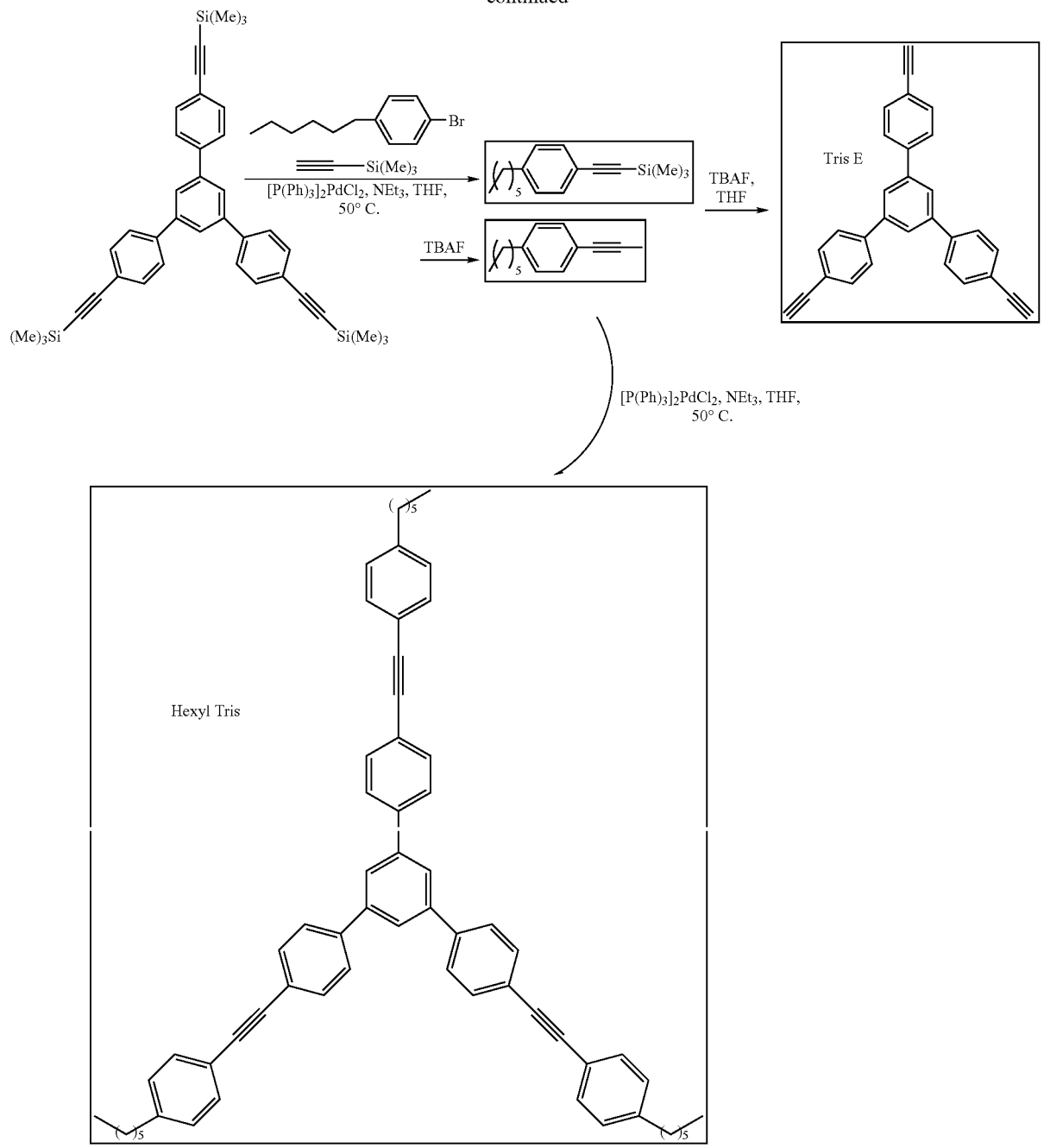

The pore generating material, i.e., porogen, that is present in the composition of matter of the present invention is a thermally labile polymer which is substantially dispersed within the b-staged thermosetting resin. The porogen employed in the present invention is preferably a pore generating polymer. The porogen is removed from the composition of matter of the present invention by decomposition, either by thermal means or by ionizing radiation induced decomposition, leaving stable nano-sized pores within the resultant low-dielectric film.

The porogens that may be employed in the present invention include a block copolymer wherein one of the blocks is compatible with the crosslinked matrix resin and the other block is incompatible therewith. Useful polymer blocks include polystyrenes such as polystyrene and poly-α-methylstyrene, polyacrylonitriles, polyethylene oxides, polypropylene oxides, polyethylenes, polyactic acids, polysiloxanes, polycaprolactones, polyurethanes, polymethacrylates, polyacrylates, polybutadienes, polyisoprene, polyvinyl chlorides, and polyacetals, and amine-capped alkylene oxides (commercially available as Jeffamine™ polyether amines from Huntsman Corp.).

Other examples of porogens that may be employed in the present invention include: thermoplastic homopolymers and random (as opposed to block) copolymers. The term "homopolymer" denotes a compound comprising repeating units from a single monomer. Suitable thermoplastic materials include, but are not limited to: polystyrenes, polyacrylates, polymethacrylates, polybutadienes, polyisoprenes, polyphenylene oxides, polypropylene oxides, polyethylene oxides, poly (dimethylsiloxanes), polytetrahydrofurans, polyethylenes, polycyclohexylethylenes, polyethyloxazolines, polyvinylpyridines, polycaprolactones, polyactic acids, copolymers of these materials and mixtures thereof. The thermoplastic materials may be linear, branched, hyperbranched, dendritic, or star like in nature.

The porogen may also be designed to react with the crosslinkable matrix precursor during or subsequent to b-staging to form blocks or pendant substitution of the polymer chain. For example, thermoplastic polymers containing reactive groups such as vinyl, acrylate, methacrylate, allyl, vinyl ether, maleimido, styryl, acetylene, nitrile, furan, cyclopentadienone, perfluoroethylene, oxytrifluorovinyl, pyrone, propiolate, phenyl propriolate or orthrodiacetylene groups can form chemical bonds with the crosslinkable matrix precursor, and then the thermoplastic porogen can be removed to leave pores.

The porogen may also be a material that has an average diameter of from about 1 to about 50 nm. Examples of such materials include dendrimers (available through Dendritech, Inc.), hyperbranched polymer systems, latex polymers, star shaped and dendritic polymers. These materials may be non-reactive with the crosslinkable matrix precursor, or reactive as described above. For reactive incorporation, this may be due to functionality directly incorporated into the porogen or alternatively via a linker capable of reacting with both the resin and the porogen.

A highly preferred porogen that may be employed in the present invention is crosslinked polystyrene nanoparticles that are prepared by microemulsion techniques.

In addition to the above components, the composition of matter of the present invention may also include a solvent. The solvent may be any known solvent that useful in processing thermosetting resin compositions. The solvent may be a single solvent or a mixture of solvents may be employed. Illustrative examples of suitable solvents that may be employed in the present invention include, but are not limited to: mesitylene, pyridine, triethylamine, N-methylpyrrolidinone, methyl benzoate, ethyl benzoate, butyl benzoate, ethyl lactate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, toluene, xylene, benzene, dipropylene glycol monomethyl ether actetate, dichlorobenzene, propylene carbonate, alkyl alkoxypropionates, naphthalene, diphenyl ether, γ-butyrolactone, dimethylacetamide, dimethylformamide and mixtures thereof. The solvent may also include a supercritical fluid such as, for example, supercritical $CO_2$. The pressure of the solvent may range from atmospheric to supercritical, with supercritical being preferred in some embodiments.

The composition of matter of the present invention described hereinabove can be used to make low-k dielectric films and interlayers dielectrics for integrated circuits in accordance with known procedures. Specifically, the low-k dielectric films are prepared by first applying the composition of matter of the present invention onto a surface of a substrate utilizing known deposition techniques such as chemical vapor deposition, plasma-assisted chemical vapor deposition, evaporation, spin-on coating, dip coating, brushing and the like. Preferably, the composition of matter of the present invention is applied by spin-on coating.

The term 'substrate' is used herein to denote any semiconducting material, any conductive material, any insulating material or any combination, including multilayers thereof. Examples of semiconducting materials include, but are not limited to: Si, SiGe, SiC, SiGeC, GaAs, InAs, InP and other III/V compound semiconductors. The term "semiconducting" also includes silicon-on-insulator materials.

Examples of conductive materials include, but are not limited to: polysilicon, metals, metal alloys, and metal silicides. Illustrative examples of insulating materials include oxides, nitride and oxynitrides.

After applying the composition of matter of the present invention to a suitable substrate, the resultant structure containing the composition of matter of the present invention is heated to a temperature that is sufficient to vitrify the composition. Specifically, this heating step is performed at a temperature of from about 200° to about 350° C. for a time period of from about 60 to about 3600 seconds. More preferably, this heating step is performed at a temperature of from about 200° to about 300° C. for a time period from about 60 to about 3600 seconds.

In accordance with the present invention, the presence of the reactive additive in the composition of matter lowers Tv-comp below that of Tv-resin due to plasticization.

Next, the pore generating material present in the composition of matter is decomposed therefrom utilizing known heat treatment steps or radiation-induced decomposition providing a porous layer of cured material on the surface of the substrate. The porous layer of cured material provided in the present invention is characterized as a low-k material having a dielectric constant of less than about 3.9, preferably less than about 3.0, most preferably less than about 2.5. Moreover, the porous layer of cured material has nano-sized pores that are stable and do not collapse upon further high temperature heat steps. The term "nano-sized pores" as used in conjunction with the porous layer of cured material denotes a pore size of less than about 10 nm, with a pore size of less than about 7 nm being more highly preferred.

When a heat treatment is used to decompose the porogen from the material, the temperature of such treatment is from about 350° to about 450° C. and the decomposition time is from about 60 seconds to about 4 hours. More preferably, porogen decomposition occurs at a temperature of from about 350° to about 430° C. for a time period of from about 60 seconds to about 4 hours. When radiation-induced decomposition is employed, a laser, such as an excimer laser, is employed. Alternatively, ionizing radiation such as e-beams, α-rays, or X-rays may be used.

The following examples are provided to illustrate the present invention and to show the effects that the reactive additive has on organic thermosetting resins. The resin was prepared in accordance with the present invention, unless otherwise stated.

In some examples, the nomenclature Matrix 3/2, Matrix 1/1, Matrix 0.9, Matrix 0.8, Matrix 0.7 are employed. This nomenclature denotes a polyarylene resin that is prepared by reacting compound 1 with compound 2

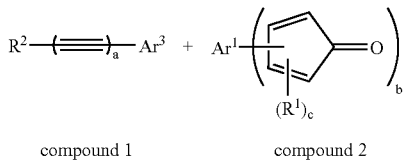

compound 1        compound 2 where $R^2$, $Ar^3$, $Ar^1$, and $R^1$ are as defined above, c is 0, 1, 2 or 3, a=3, and b=2 using the techniques described for example, in U.S. Pat. Nos. 6,359,091, 6,288,188, 6,252,001, 6,121,495 and 5,965,679, the entire contents of each are incorporated herein by reference. For Matrix 3/2 the equivalents of compound 1 is one and the equivalents of compound 2 is 1.5; for Matrix 1/1 the equivalents of compound 1 is one and the equivalents of compound 2 is one; for Matrix 0.9 the equivalents of compound 1 is one and the equivalents of compound 2 is 0.9; for Matrix 0.8 the equivalents of compound 1 is one and the equivalents of compound 2 is 0.8; and for Matrix 0.7 the equivalents of compound 1 is one and the equivalents of compound 2 is 0.7.

EXAMPLE 1

Effect of the reactive additives on the matrix properties-This example demonstrates that the additives of the present invention are miscible in the polyarylene resin, that the presence of the same significantly bolsters the crosslinking density in acetylene poor formulations, and that the additives significantly decrease the vitrification temperature of the polyarylene system.

The non-reversible heat flow curves provided by the modulated Differential Scanning Calorimetry (DSC) graph in FIG. 1 indicate when reactions occur within the resin. In this figure, Curve 1 is Matrix 3/2 with TRIS A; Curve 2 is Matrix 3/2 with TRIS P; Curve 3 is Matrix 3/2 powder; and Curve 4 is Matrix 3/2 with TRIS 2. When the mixtures of Matrix-3/2 with TRIS A curve is examined (curve 1), a broad exotherm from 200° C. to 250° C. was observed attributed to the Diels-Alder reaction in which residual cyclopentadienone units from the MATRIX-3/2 in the prepolymer react with acetylene units from the additive. It is at this point that the additive was chemically incorporated into the prepolymer. For TRIS 2 and TRIS P, the prepolymer becomes functionalized with a more reactive acetylenic group. Continuing along the curve, to increasing temperatures, the next thermal transition from 310°-360° C. with peak maximum at 430° C., was assigned to the thermal reaction of the phenylacetylene from TRIS A and with other phenylacetylene units contained on the Matrix-3/2 prepolymer. The heat capacity curve (Cp) revealed an initial drop in heat capacity around 200° C. region (a loss of CO from the Diels Alder reaction of the acetylene and cyclopentadiene) and another drop around 370° C. This second drop in Cp is a typical characteristic of vitrification (or a stiffening) of the resin and its assignment was confirmed with mechanical analysis. Relying on this interpretation of the DSC curves, one can draw conclusions as to which additive delivers properties favorable for the process. It appears from DSC, that TRIS 2 causes vitrification to occur at a higher temperature relative to that for TRIS A and TRIS P. Of the three additives shown, TRIS P stiffens the matrix at the lowest temperature (340° C.). The DMA curves are now considered.

Figure 2:
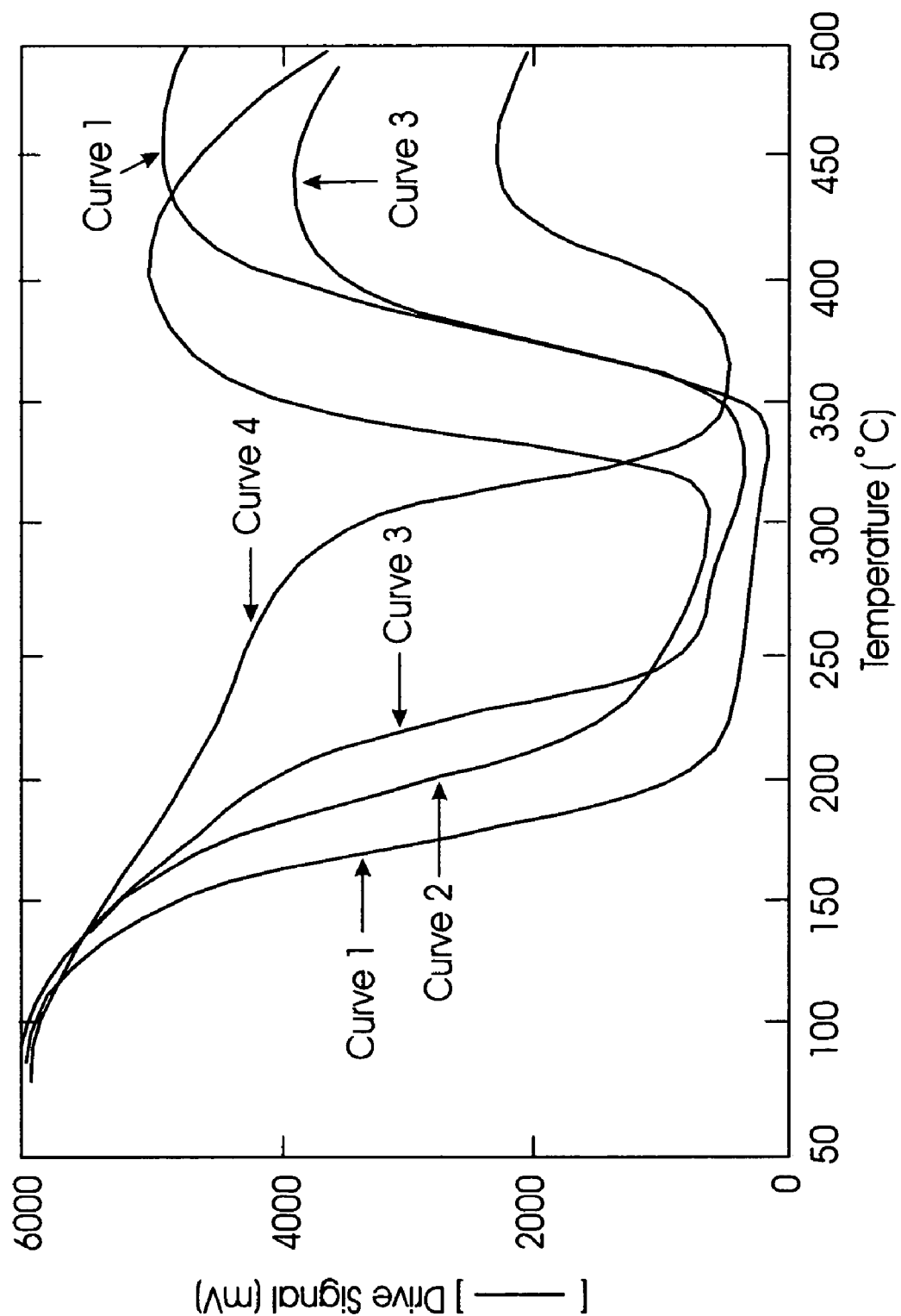
FIG. 2 is a graph showing DMA (Dynamic Mechanical Analysis) curves of polyarylene resins with additives.

Dynamic Mechanical Analysis (DMA) shown in FIG. 2 supports many of the thermal assignments based on the DSC data. It is noted that the results in FIG. 2 were actually obtained on a Matrix 1:1 resin but the results are still informative, as similar reactions occur in both resins. In FIG. 2, Curve 1 is for Matrix 1:1 with 20% TRIS A; Curve 2 is for Matrix 1:1 with 20% TRIS P; Curve 3 is for Matrix 1:1 with 20% TRIS 2; and Curve 4 is for Matrix 1:1. The DMA results clearly show how the additives perform as a reactive diluent. At a temperature of 300° C., the Matrix 1:1 resin containing no additive clearly had a higher drive signal compared to the other resins which contain the additives. When the additives themselves are compared, TRIS 2 relative to TRIS A and TRIS P provides a stiffer material at 230° C. In the presence of the additives, the Matrix 1:1 resin in general, reaches a soft rubbery region between 250°-320° C. Subsequent vitrification of the resin is reflected by the increase of the drive signal with temperature and it is apparent from the data in FIG. 2 that the additives decrease the temperature at which this stiffening occurs relative to the neat polyarylene resin. TRIS A and TRIS 2 show an onset of stiffening at 350° C. and achieve a maximum drive signal between 440°-450° C. It is apparent that TRIS P provides the earliest onset of vitrification (~320° C.) and reaches a maximum in modulus at 410° C.

The data provided above demonstrates that the addition of an reactive additive such as TRIS 2 resulted in polyarylene resins with a lower Tg, consistent with miscibility, and the additive significantly lowered the vitrification temperature of the resin system.

EXAMPLE 2

Evidence for unexpected TTT diagram behavior.

The proceeding section describes how the low molecular weight acetylene monomers have a profound effect on the curing and resulting modulus of a polyarylene resin. As described, during the thermal ramp to the cure temperature, one role of the additive was to create a situation where the Tg of the material went to a temperature above the actual curing temperature of the system, i.e., to alter the TTT diagram. To investigate this phenomenon, additional DSC data are presented.

Figure 3:
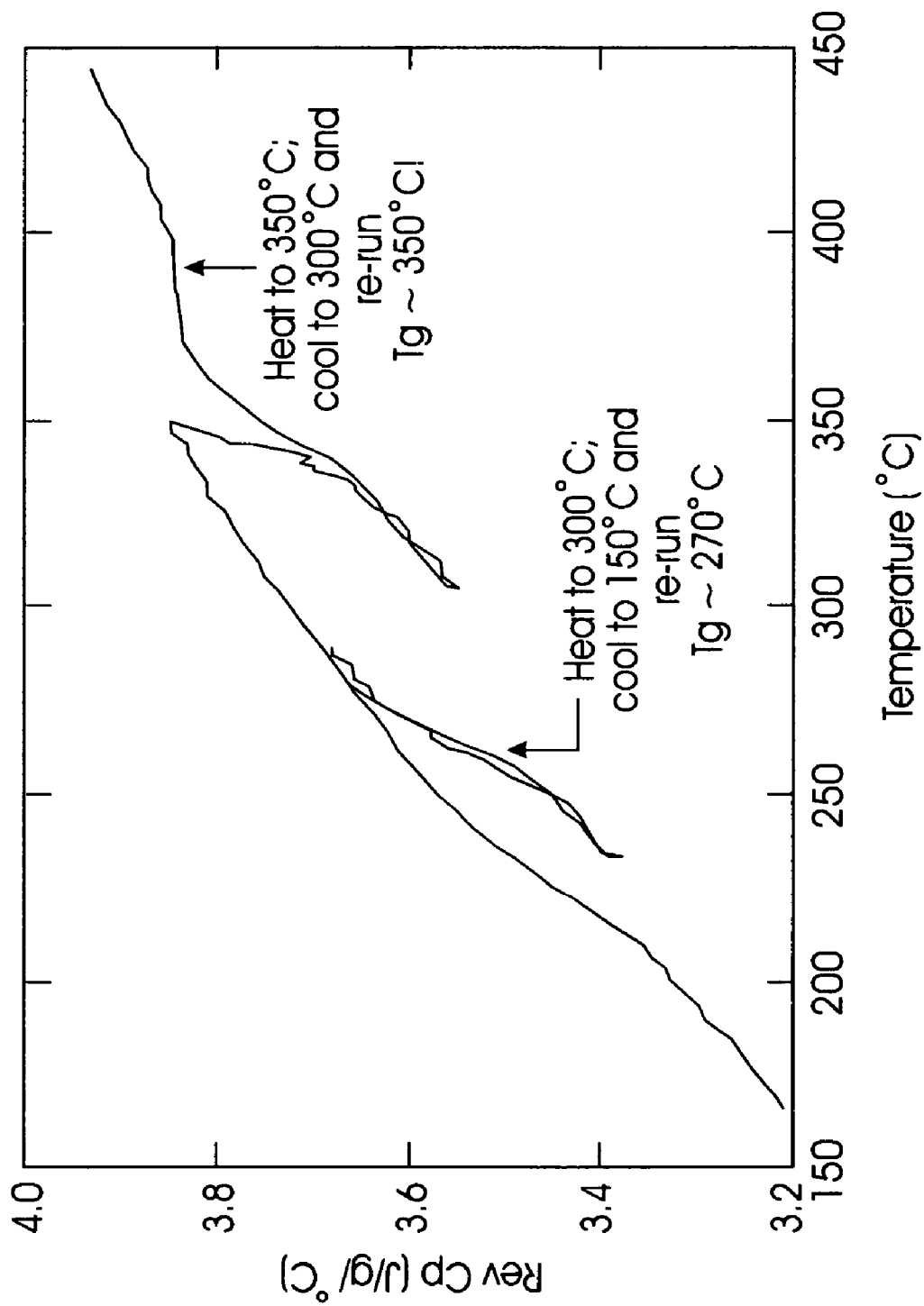
FIG. 3 is a graph showing DSC curves of polyarylene resins with an additive.

Curve 1 of FIG. 3 shows that when the resin is heated to 300° C. and re-run, the measured Tg of the resin is roughly 270° C. As the resin was heated at 5° C./minute, the Tg lagged behind by 20°-30° C. which is typical of thermosets. When a temperature which corresponds to the reaction of the reactive diluent was reached, in this case acetylene monomer TRIS P, the crosslinking reaction occurs and the Tg of the resin overtakes the cure temperature. For example, when the resin containing TRIS P was heated to 350° C. at 5° C. per minute, the Tg of the thermoset was at 350° C., which is not normal for thermosets.

Figure 4:
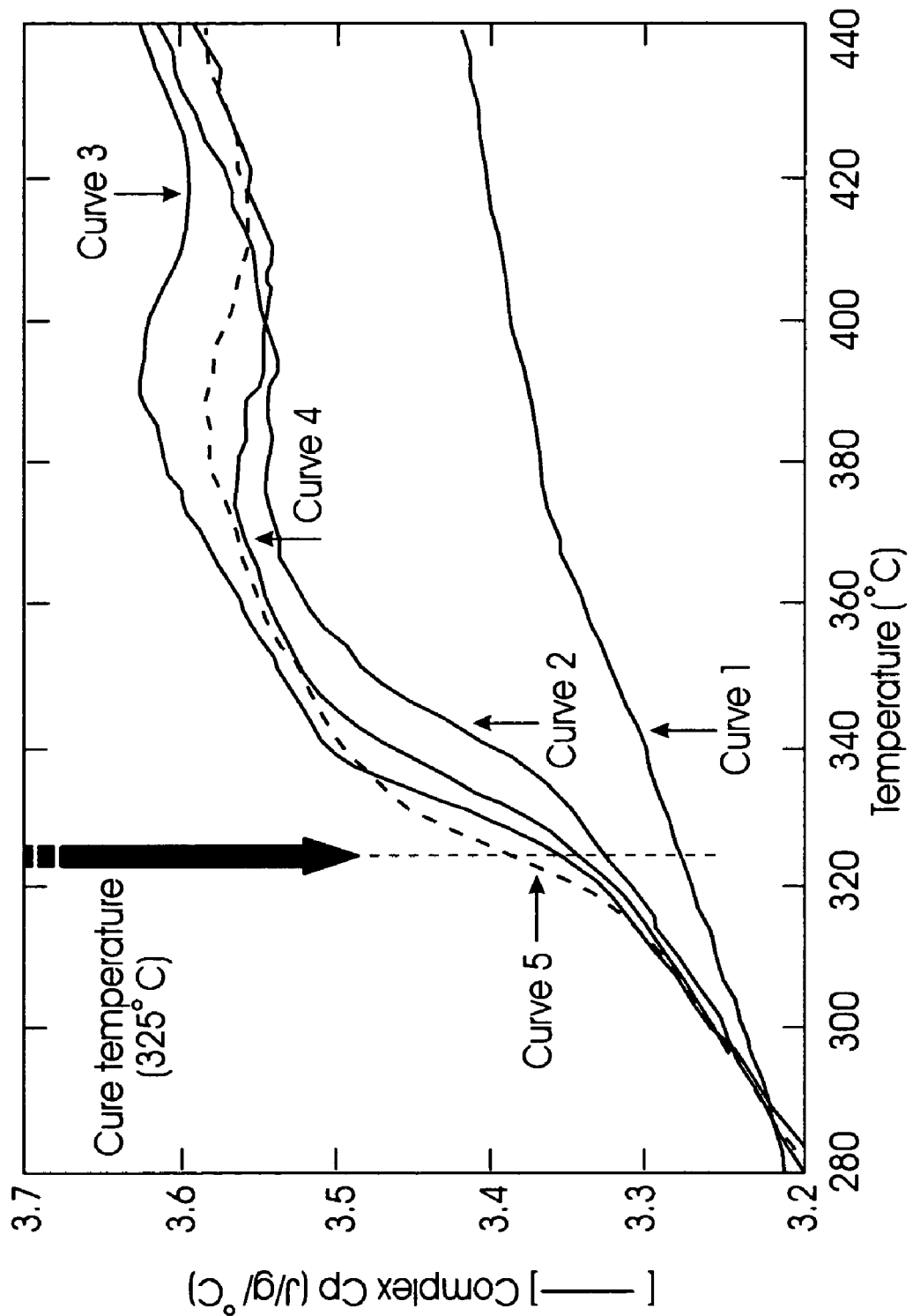
FIG. 4 is a graph showing the altering of the TTT (time-temperature-transformation) diagram of a polyarylene resin with additives.

FIG. 4: Altering the TTT diagram of Matrix 1:1 with additives. In this experiment samples were heated to 325° C. and then held at this temperature for 1 hour. In this figure, Curve 1 is for Matrix 1:1 with 20% TRIS P; Curve 2 is for Matrix 1:1 with 10% TRIS P; Curve 3 is for Matrix 1:1; Curve 4 is for Matrix 1:1 with 10% TRIS 2; and Curve 5 is for Matrix 1:1 with 5% TRIS A. The samples were then cooled and then the DSC curves showed an increase in Tg of the resins associated with the different types of reactive small molecules added to the polyarylene resin.

The experiment that is depicted in FIG. 4 shows clearly how the Tg of the resins increase to and rise above the cure temperature. For reference, curve 3 is similar to the Matrix 1:1 without an additive. When the polyarylene resins are held at 325° C. for one hour and the samples re-run, the Tg of the resins containing the additives (TRIS A, TRIS 2 and TRIS P) increased above the cure temperature. In particular, when a sample containing additive TRIS P (10 wt. % with respect to resin was cured, the Tg of the resin increased to 355° C., a value 30° C. above the cure temperature. When 20 wt. % of reactive TRIS P is put into the Matrix 1:1 resins, the polyarylene resin has reached a vitrification state, and the Tg is not measurable under these conditions (i.e., Tg $\infty$).

Figure 5:
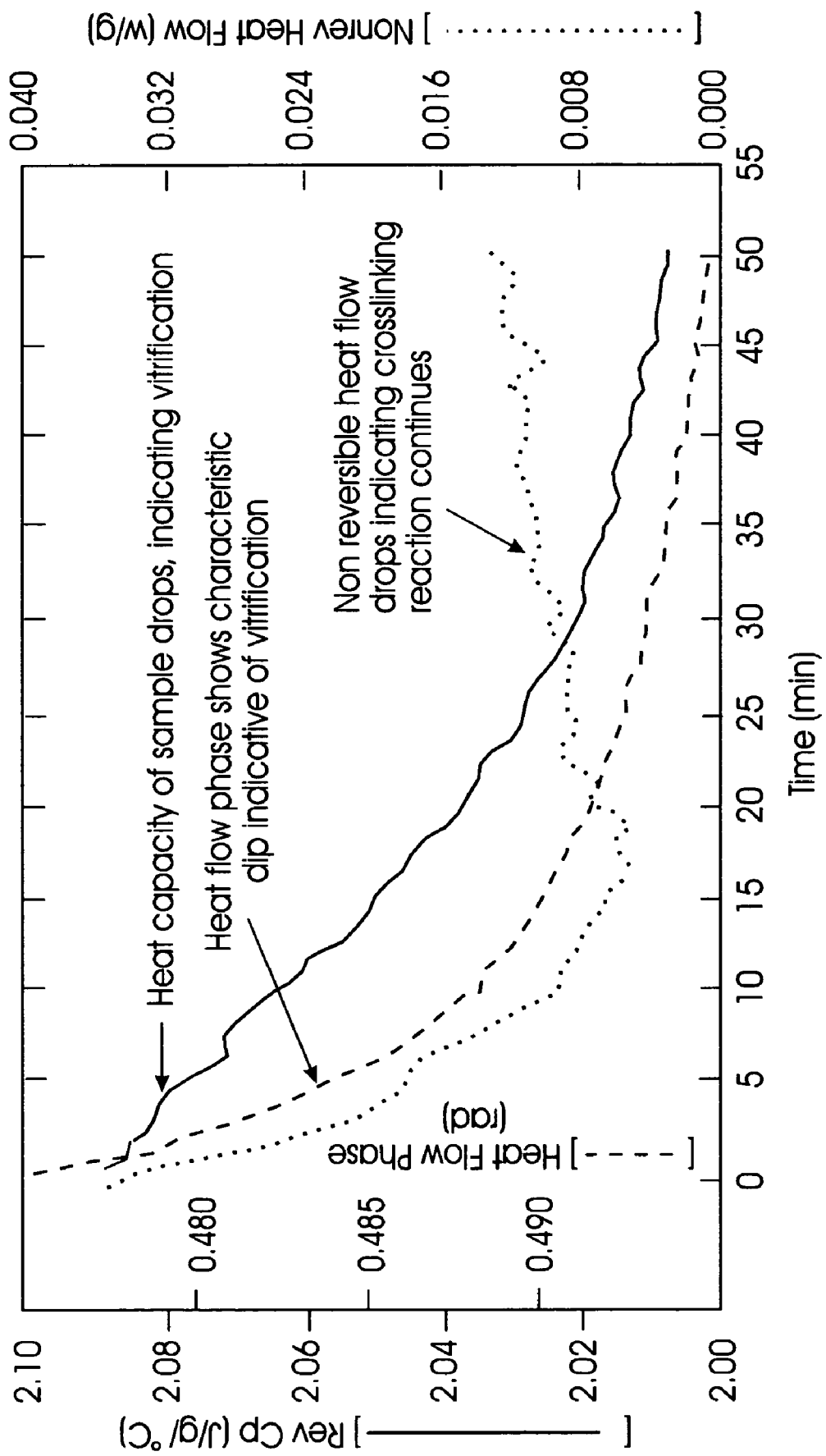
FIG. 5 is a graph monitoring the heat capacity, heat flow and non-reversible heat flow occurring where a polyarylene resin and 20 wt. % additive are heated isothermally at 325° C.

FIG. 5 shows the various DSC curves as the polyarylene resin was cured at 325° C. Indicative of vitrification, the heat capacity drops during the 325° C. cure, similarly the minimum point seen in the heat flow curve reflects the point of vitrification.

Conclusions: The use of acetylenic based monomer structures in polyarylene matrices provides a plasticization period which is followed by a vitrification above a critical temperature (here 325° C). The additives lower the vitrification temperature relative to the neat resin leading to an unusual TTT behavior that enables porogen burnout in the glassy state with retention of nano-sized pore.

EXAMPLE 3

Compatibilization of Pore Generating Molecules in a Polyarylene Thermosetting Resin; the process for nucleation and growth phase separation process for porogen and polyarylene resin.

Two general strategies have been developed for the generation of porous polyarylenes: the first involves the tempting of porosity by an arrested nucleation and growth (N/G) process of a porogen with the polyarylene, while the second relies on a performed template or nanoparticle to define the hybrid morphology and ultimately the porous structure. Considerable work was directed towards the preparation of star-shaped and related polymer architectures, designed to be initially miscible with polyarylene resins and the phase separates upon network formation via an arrested N/G process. Defining the processing conditions is tedious and stringent control of the chemistry (i.e., mol. Wt., functionality, architecture, etc.) must be carefully defined to enable initial miscibility. Since the range of molecular weights to facilitate is narrow, the use of additives significantly simplifies this process.

Figure 6:
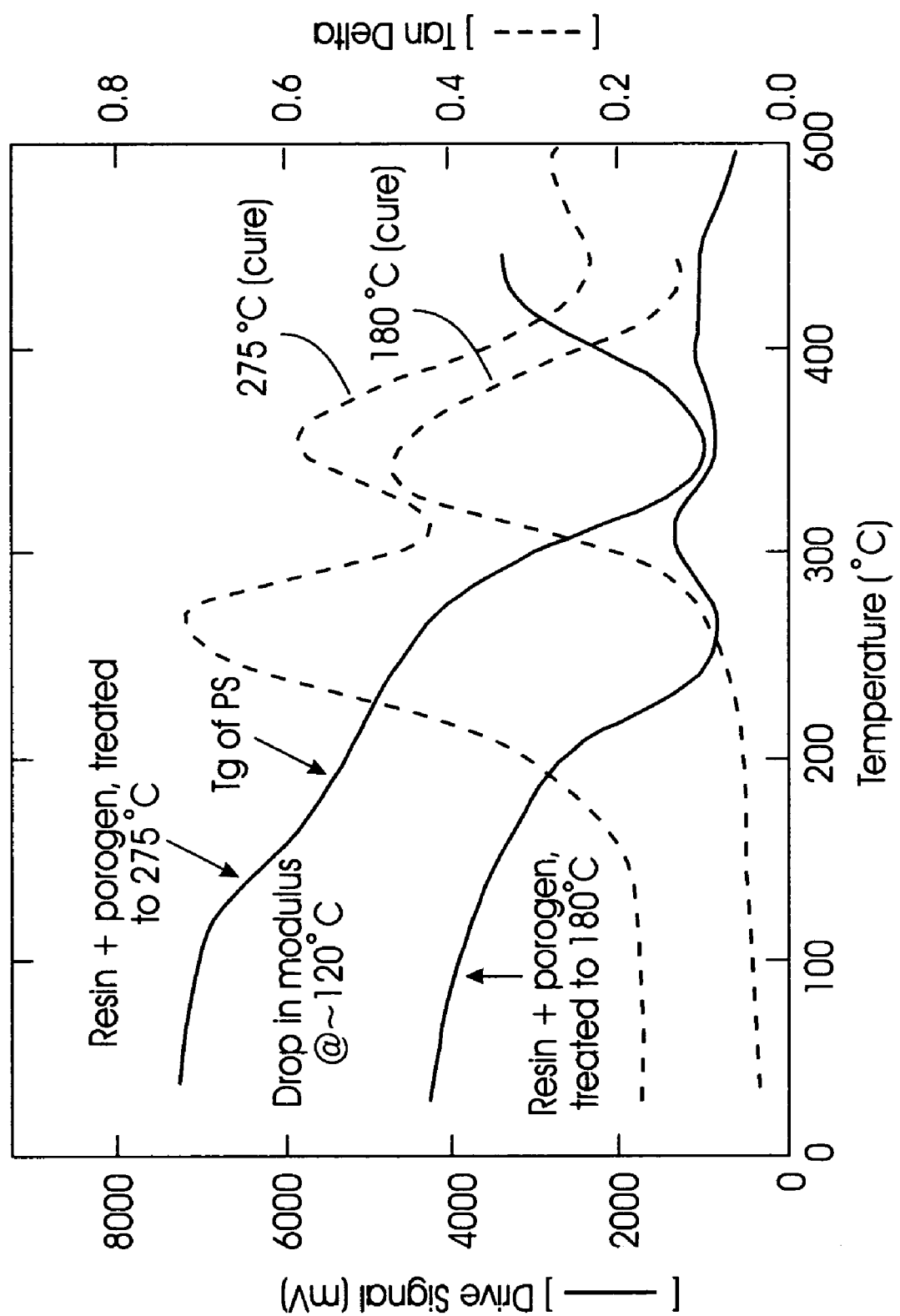
FIG. 6 is a graph showing the DMA curves demonstrating how reactive additives dissolve a polystyrene star porogen into a polyarylene resin.

The DMA curves show how the reactive diluents dissolve a polystyrene star porogen into the polyarylene resin and then upon thermal cure and advancement of the molecular weight of the resin, the polystyrene star shaped macromolecule phase separates to create nano-size polystyrene rich regions, which upon thermal decomposition, leaves a nanometer sized hole. The DMA curves in FIG. 6 show how a polyarylene thermosetting resin+reactive diluent (TRIS 2) and a pore generating material (polystyrene star) behave.

Curve 1 is where the resin was treated to 180° C. for one hour. No Tg at 120° C. which would correspond to a polystyrene rich phase, was evident in either the drive signal or the tan delta for this measurement. This indicates that the polystyrene was completely miscible/compatible with the thermosetting resin+reactive diluent. Upon a cure to 275° C., a Tg at 120° C. which corresponds to polystyrene was evident in both the drive signal and the tan delta. This indicates as stated above that upon advancement of the molecular weight of the matrix a phase separation of the pore generating material had occurred to give the polystyrene rich nano-sized domains (characterized by FE-SEM for example), which then result in the nanoporous material.

EXAMPLE 4

One of the main goals of generating a nano-particle with a low volume swell factor (VSF) was to produce a material that does not absorb the polyarylene resin into the particle interior. Under these circumstances, it is reasonable that the true size of the particle will be templated when used in a thermosetting resin.

Through extensive studies with the particles in polyarylene thermosetting resins, one thing has experimentally become apparent: the addition of TRIS 2, a reactive diluent, to the polyarylene resins (monomer stoichiometries ranging from 1:1 to 0.7:1 acetylene/cyclopentadienone) results in better templating of the particles than with the pure resins themselves. This approach was more effective than adding an excess of TRIS A during the b-staging reactions. Dielectric measurements, film thickness changes on wafers and refractive index measurements indicated that the presence of TRIS 2 results in a polyarylene film with better dielectric properties than samples without the additive. One early rationalization was that the solubility parameter of TRIS 2 was such that it does not penetrate the polystyrene (PS) particles. To test this hypothesis, studies were carried out to investigate the solubility characteristics of TRIS 2 relative to TRIS A. However, DSC Measurements showed that both of the reactive diluents TRIS 2 and TRIS A caused a significant Tg depression of the polystyrene nanoparticles, consistent with the production of a mixed phase, but this characteristic allows the particles to be compatibilized in the resin.

Figure 7:
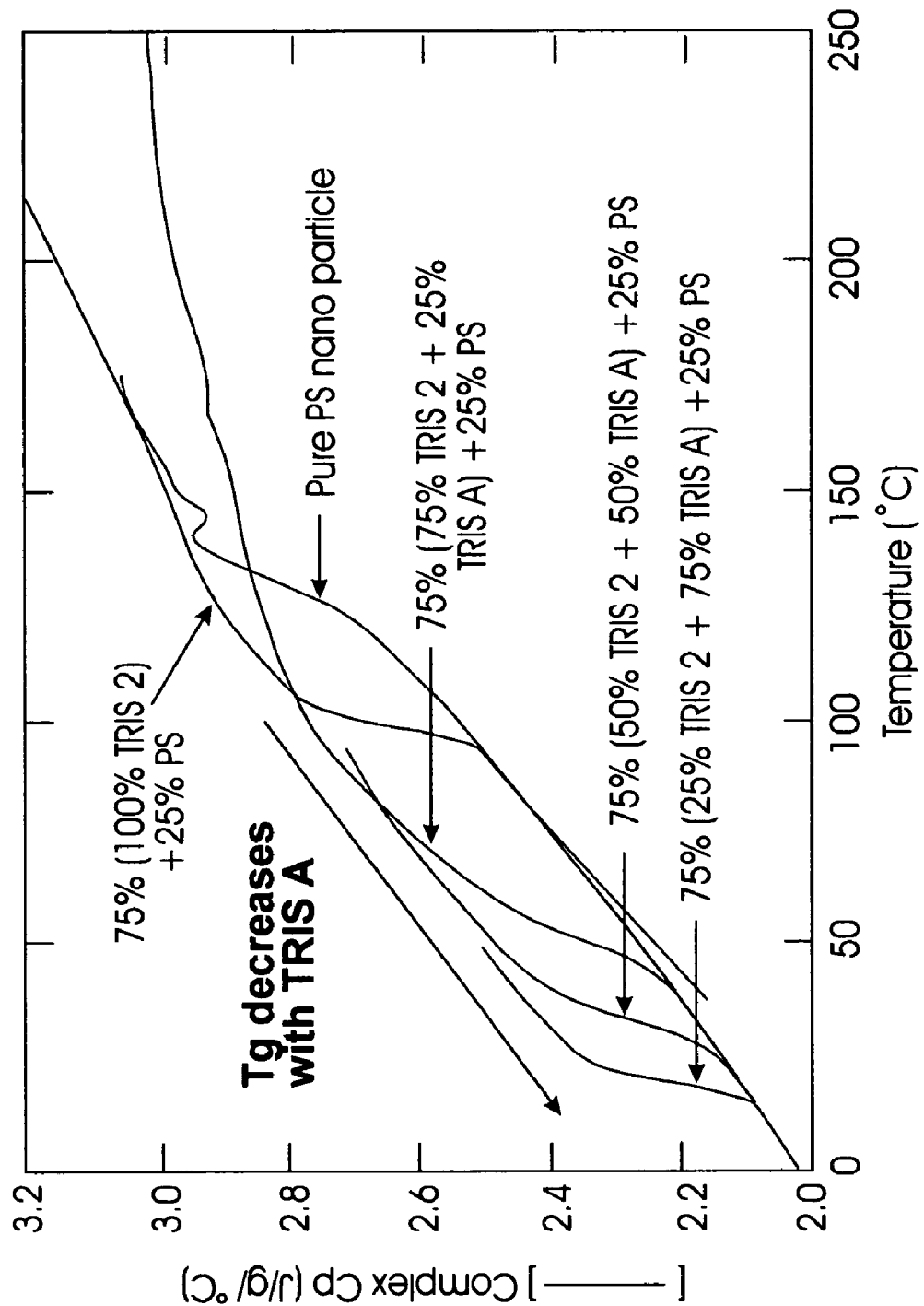
FIG. 7 is a graph showing the DSC curves of nanoparticles containing varying amounts of additives.

When the solubility parameters for TRIS 2 and TRIS A were calculated (for example Small's G solubility parameter for TRIS 2 was estimated to be 18.6 $J^{1/2}$ $cm^{3/2}$ while TRIS A was calculated as 19.1 $J^{1/2}$ $cm^{3/2}$) the difference is relatively small. This would be expected intuitively based on the similarity of structure. Therefore the question remains, why is TRIS 2 a more effective additive than TRIS A (vide-infra)? As both molecules contain the same type and number of reactive functional groups one can assume that the rate constant for polymerization and or crosslinking should be similar. The main difference between the TRIS A and TRIS 2 lies in their molecular weight with TRIS 2 having a mass 1.8 times that of TRIS A. A general concept which is described in Van Krevelens 'Properties of Polymers' and in the introduction of his chapter on solubility, "as a general rule, the solubility decreases as the molecular weight of the solute increases . . . this property can be used to fractionate polymers according to molecular mass." From experiment, it was determined that TRIS monomers (FIG. 7) are absorbed into the nanoparticles and upon cure, due to the higher molecular weight of the TRIS 2 monomer, the precipitation point of the TRIS 2 polymer from polystyrene is reached rapidly. It is believed that the precipitation point from the nanoparticles is reached faster for TRIS 2 than for TRIS A (i.e., the point, before precipitation where $\Delta G=0$, and therefore $\Delta H=T\Delta S$, where $\Delta S$ reaches its minimum value).

Typically, 25 percent (dry weight) of TRIS 2 is added to the various polyarylene formulations, this volume fraction of matrix moving out from the particle helps create a greater phase purity within the nanoparticle. It is theorized herein that this is a new concept, as previous foaming strategies from matrices have focused on the pore generating material phase separating from the matrix and creating pore generating rich domains. The strategy of the present invention focuses on the opposite direction, namely, low molecular weight matrix monomers leaving the porogen through molecular weight increase during cure, thus creating a pure polystyrene nanoparticle template.

Figure 8:
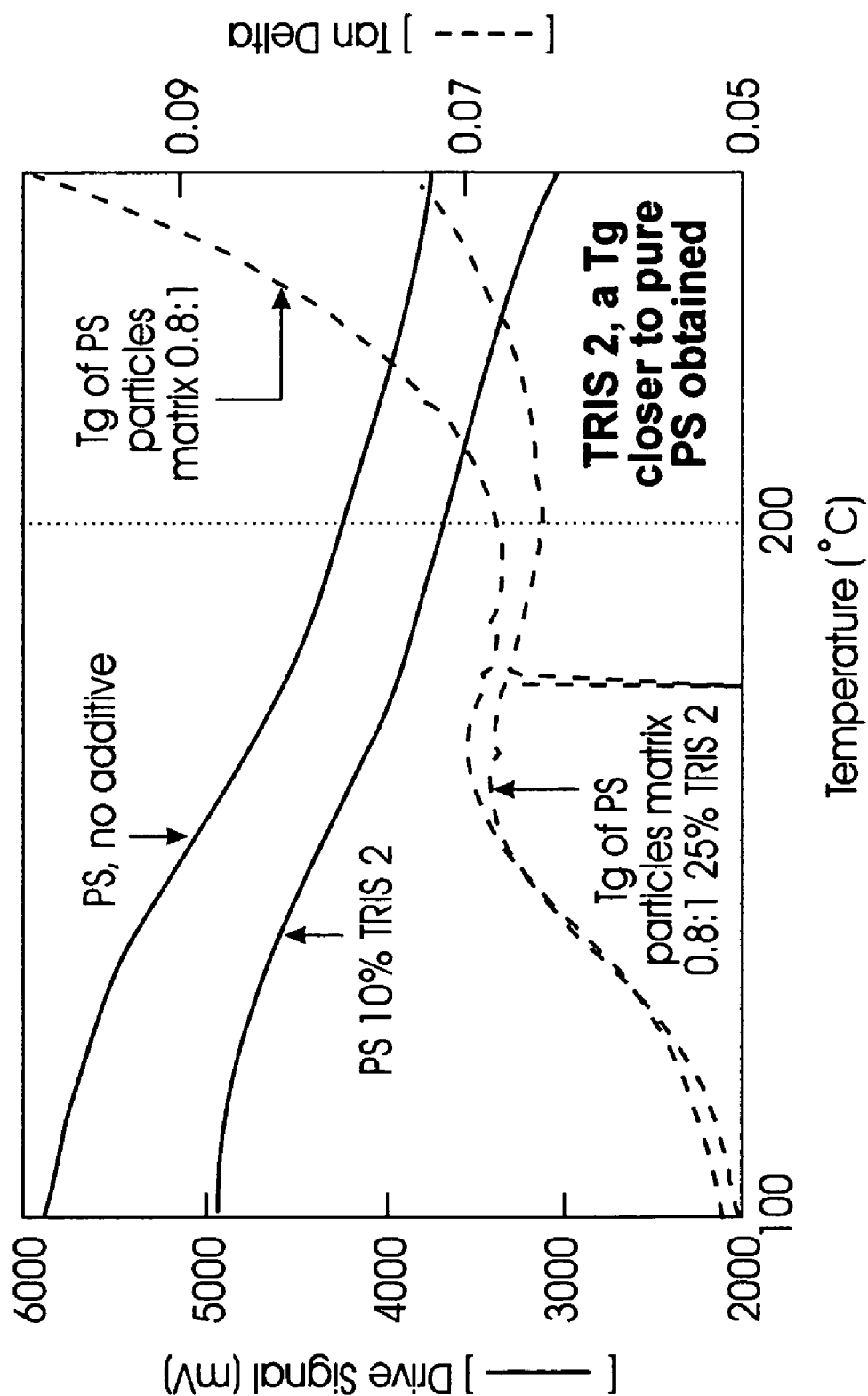
FIG. 8 is a graph showing the DMA thermogram of two partially cured polyarylene resins containing polystyrene nanoparticles, one with additive and the other without additive.
Figure 9C:
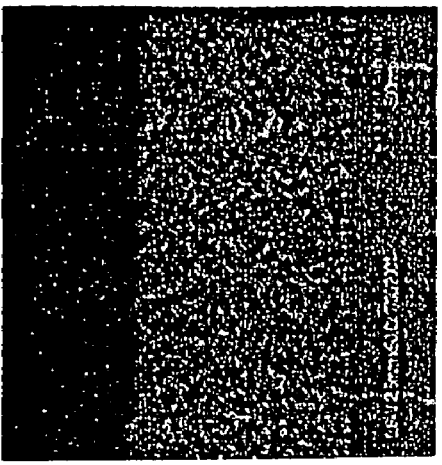
FIGS. 9A-C are SEMs (Scanning Electron Micrographs) of polyarylene resins with crosslinked polystyrene nanoparticles.
Figure 9B:
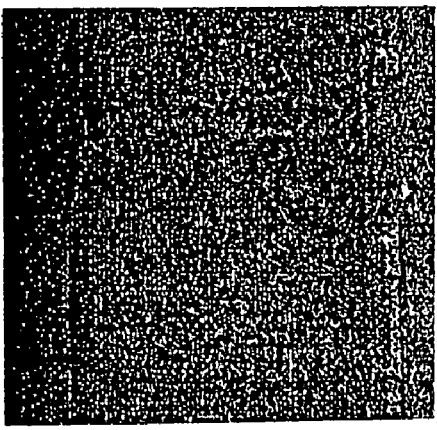
Figure 9A:
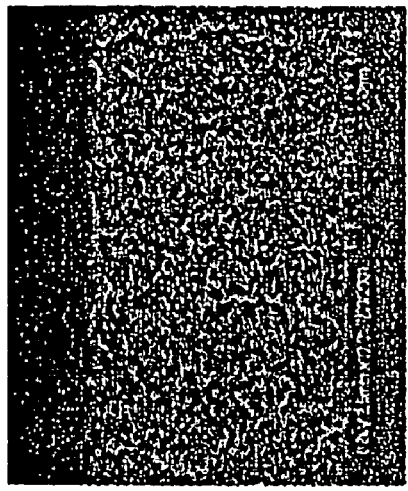

Tan delta measurements from DMA analysis of the particles in the polyarylene resins (FIG. 8) indicate that the Tg of the nanoparticle in the resin with the TRIS 2 was closer to that of the pure porogen alone, suggesting that in a partially cured polyarylene resin, the TRIS 2 monomer was already precipitating from the polystyrene nanoparticle. The Tg of the polystyrene nanoparticle in partially cured Matrix 0.8 without TRIS 2 showed a higher mixed Tg, suggesting a higher content of the polyarylene resin in the nanoparticle.

Figure 10C:
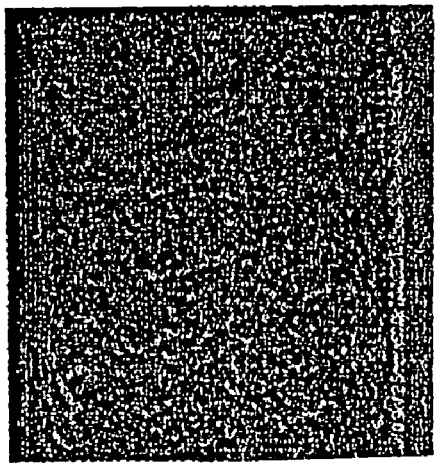
FIGS. 10A-C are SEMs of polyarylene resins with crosslinked polystyrene nanoparticles and additive.
Figure 10B:
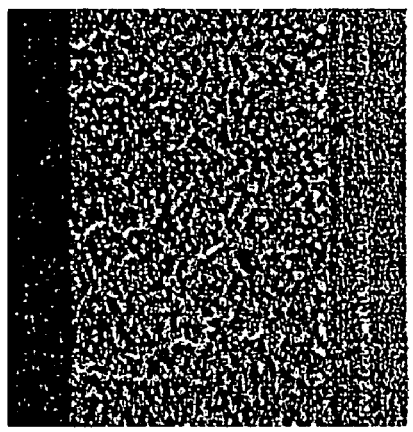
Figure 10A:
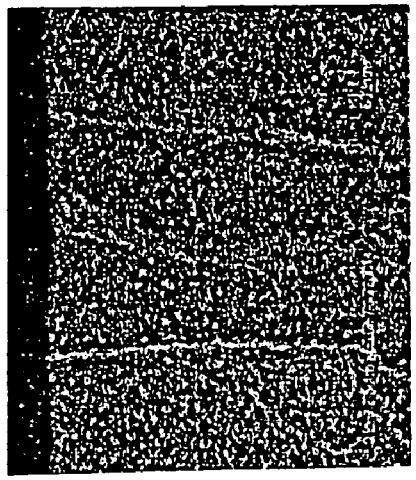

The incorporation of TRIS 2 into the nanoparticles appeared to be reflected in some of the SEMs, (see FIGS. 9A-C and 10A-C). In the Matrix 1:1 pictures without TRIS 2 (FIGS. 9A-C), the polystyrene nano-particles can be seen more clearly than the series of pictures with TRIS 2 added (FIGS. 10A-C). The particles appear as white objects in FIGS. 9A and 10A. Refractive indices (RI) are given for the samples through out the cycle, and after burnout the lower RI of the resin in FIG. 10C is an indication of a relatively more porous material for the sample shown in FIG. 9C. In FIG. 10B, it is suggested that the TRIS 2 reactive diluent was masking the particles and was thus more difficult to see by FE-SEM.

Figure 11:
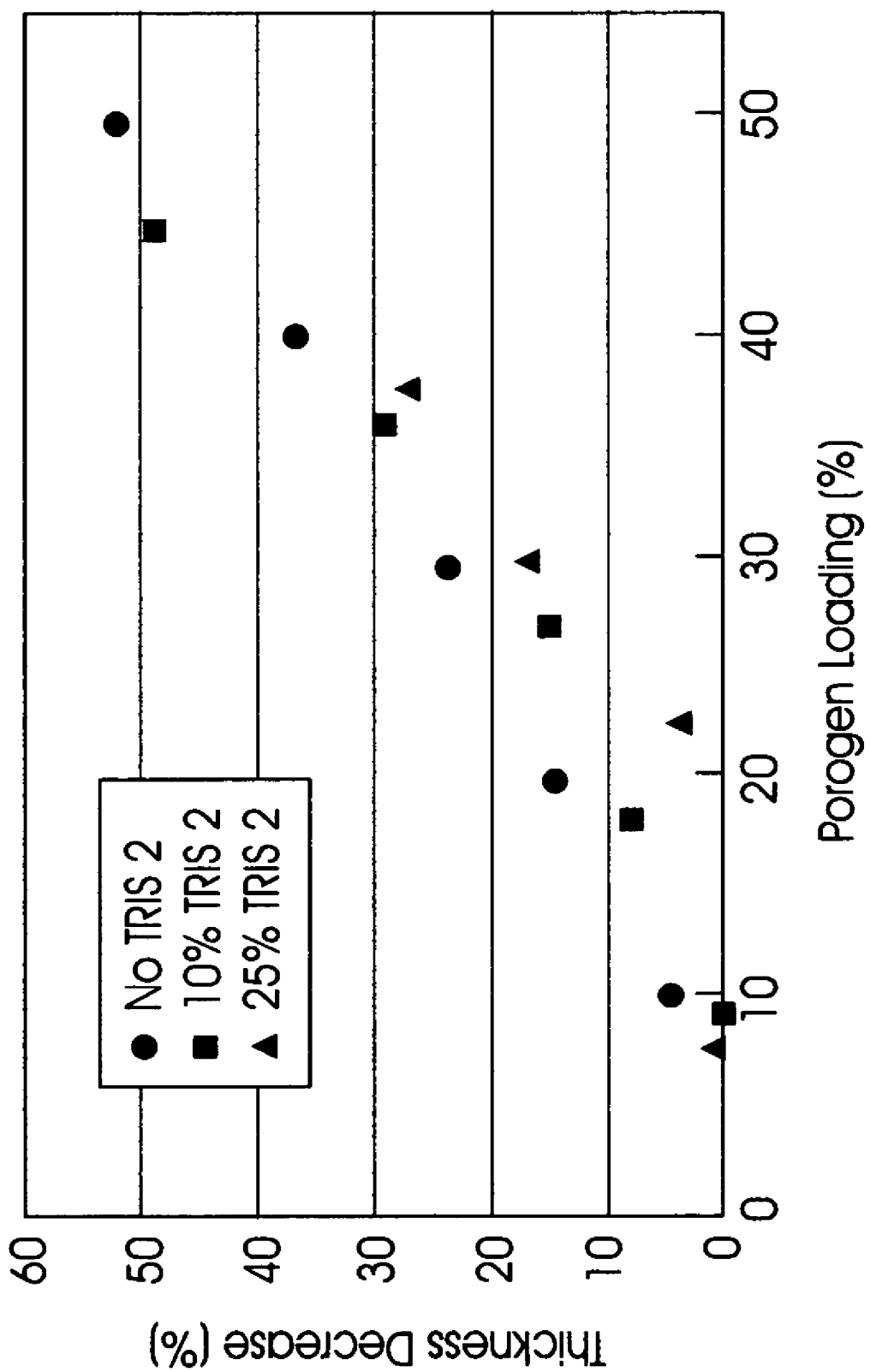
FIG. 11 is a plot showing the thickness changes measured for spun films of a polyarylene resin upon curing from 300° C. vs. 430° C. with different wt. % of additive added.

The improved foaming efficiency that TRIS 2 monomer provides is reflected in the film thickness changes which were measured (Filmetrics and Alpha Step). The procedure involves first the curing of resins spun on wafers and then measuring the thickness after a cure of 300° C. (which corresponds to a hybrid film before porogen burnout). Subsequent measurements were taken after the films were cured to 430° C. (at this temperature, the porogen is thermally degraded and removed from the matrix). FIG. 11 compares thickness changes in three samples, Matrix 1:1, Matrix 1:1 with 10 wt. % and Matrix 1:1 with 25 wt. % TRIS 2 after porogen burnout. At the porogen loadings of 10 wt. % polystyrene nanoparticles a small thickness change was observed the resins (0-5% film thickness change) which corresponds to a high porogen foaming efficiency. When the porogen loading is high e.g., 40 wt. % the initial porosity in the matrix is so large that the film collapses. At moderate porogen loadings (e.g., 30 wt. %), the film thickness change for the resin containing 25 wt. % TRIS 2 and porogen was less than that for the pure Matrix 1:1 resin (17% vs. 25% film thickness change).

The addition of TRIS 2 created a resin rich with phenyl acetylene functionality: Offsetting the Matrix stoichiometries to 0.9, 0.8, 0.7 of acetylene/cyclopentadienone respectively.

In the light of the promising results obtained from the addition of TRIS 2 (i.e., lower refractive indices, reduced thickness losses), resins were prepared such that during the b-staging reaction, the molar ratio of TRIS A was greatly increased relative to that of the bis-cyclopentadienone (BCPD) monomer. This was due in order to mimic the final stoichiometries produces by the addition of TRIS 2 to the b-staged Matrix 1:1 formulations.

Figure 12:
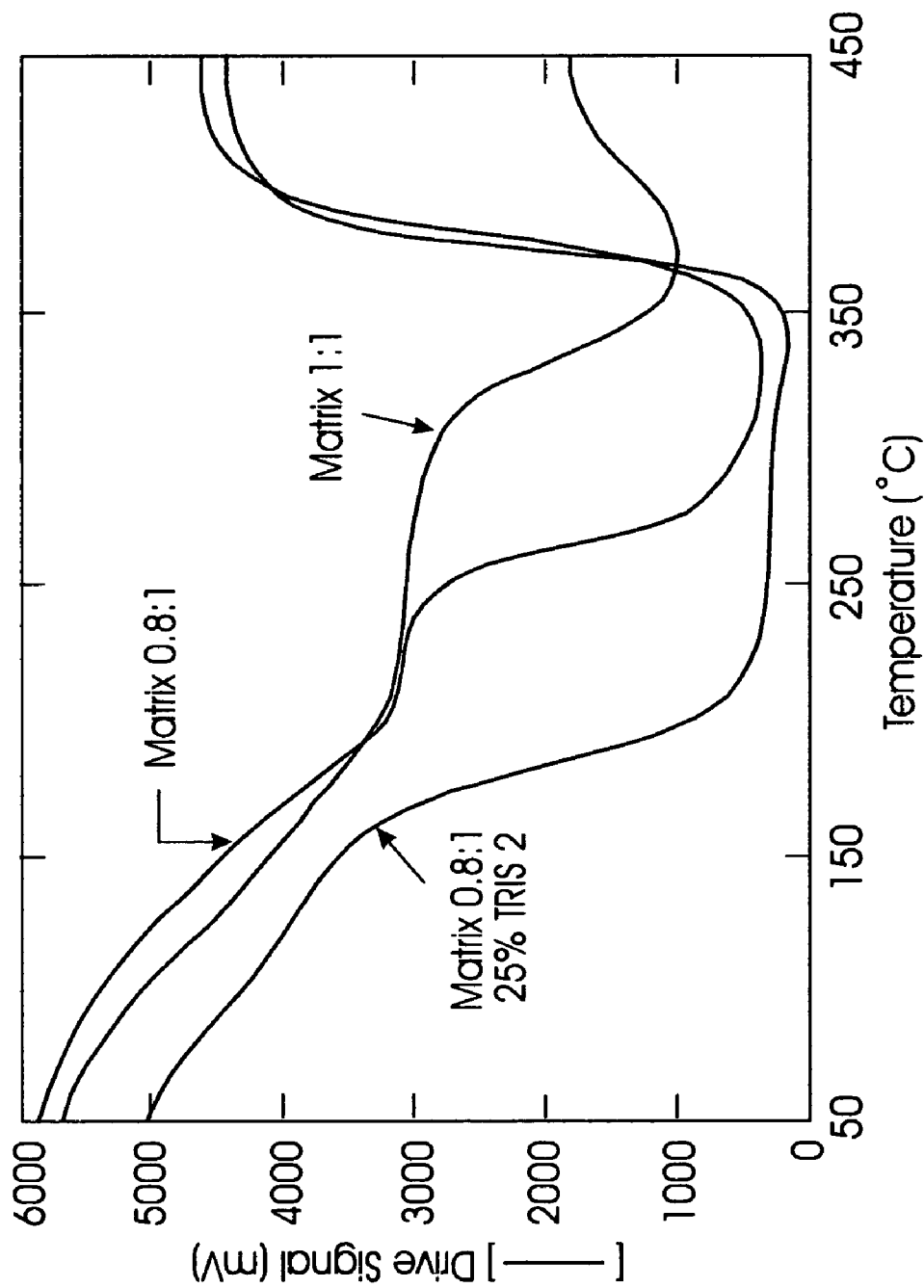
FIG. 12 is a graph showing DMA curves of various polyarylene resins with 25 wt. % additive.

DMA results (FIG. 12) showed that Matrix 0.8 resin had a thermal cure profile that was similar to that of the Matrix 1:1 resin containing 20% of TRIS 2, i.e., in each case the onset of vitrification occurred at 360° C. with the inflection point roughly around 360° C. Further, comparing the DMA curves for Matrix 0.8 and Matrix 0.8 containing 25 wt. % TRIS 2 shows that the plasticizing effect of TRIS 2 was the most striking feature, with the latter showing a softening point around 150° C.

Dielectric measurements and refractive index results on the resins enriched in TRIS A monomer also reflected the improved foaming efficiency for the offset stoichiometries, with a steady decrease in dielectric constant observed as one progresses from Matrix 1:1 resin to a Matrix 0.8 resin.

Conclusions: From the studies with the additives (TRIS 2 in particular), improvements in porogen foaming efficiencies using polystyrene nanoparticles were achieved. These studies resulted in dielectric constants as low as 2.0 for samples containing 30 wt. % polystyrene particles and 25 wt. % TRIS 2 in current polyarylene formulations. These results confirm the efficacy of additives in formulations containing polystyrene nanoparticles as porogens including crosslinked nanoparticles.

EXAMPLE 5

Figure 13B:
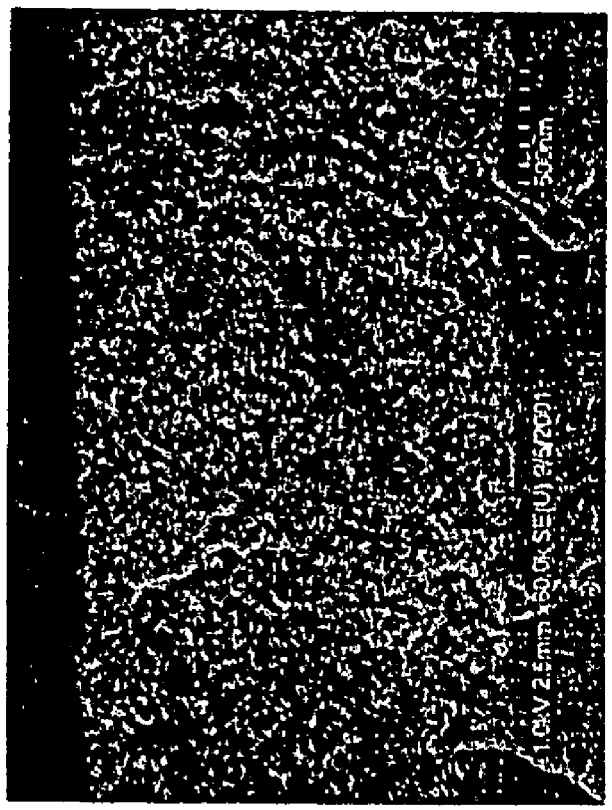
FIGS. 13A-B are SEMs of polyarylene resins without and with additive.
Figure 13A:
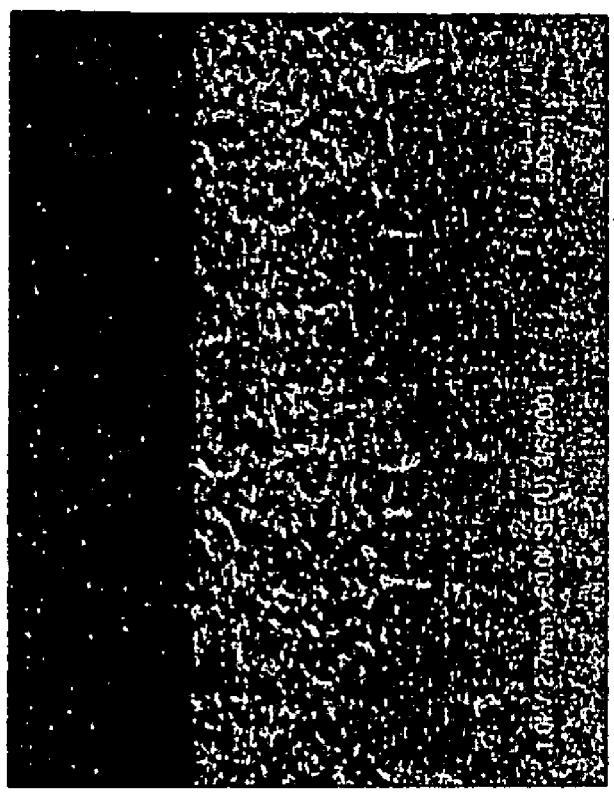

This example demonstrates the additives ability to increase the crosslinking density in the matrix allowing the matrix to resist pore collapse upon thermal decomposition. Specifically, FIGS. 13A-13B show the modification of a polyarylene polymer stoichiometry together with TRIS 2 addition. FIG. 13A represents Matrix 1:1 with 30% (9 nm) polystyrene, without additive; and FIG. 13B represents Matrix 1:1 with 30% (9 nm) polystyrene and additive. Matrix 1:1 30% PS nanoparticles has a refractive index of 1.58 and a dielectric constant of 2.41 when heated to 430° C., whereas Matrix 1:1 plus 25% TRIS 2 additive and 30% polystyrene nanoparticles has a refractive index of 1.46 and a dielectric constant of 2.15. Offset stoichiometry together with the addition of TRIS 2 additive further improves foaming efficiency and by FE-SEM produces smaller holes, unexpectedly. Offsetting the stoichiometry towards acetylene rich functional polyarylene resins coupled with the addition of TRIS 2 appears to have a pronounced affect on the morphology.

Figure 14B:
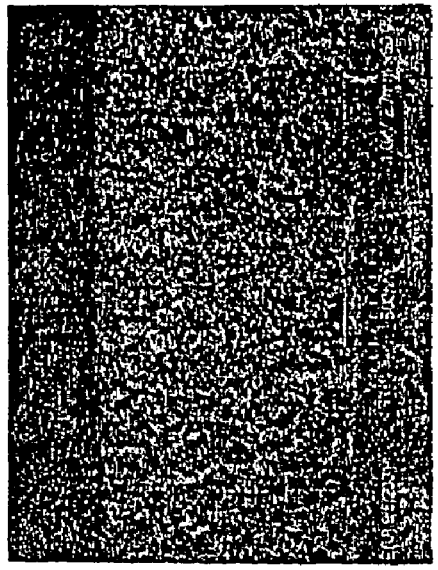
FIGS. 14A-14D are FE-SEM's (Field Emission Scanning Electron Micrographs) of porous polyarylenes generated with various stoichiometries ranging from 1:1 to 1:0.7 all having 25% additive and 40% wt. polystyrene nanoparticles.
Figure 14D:
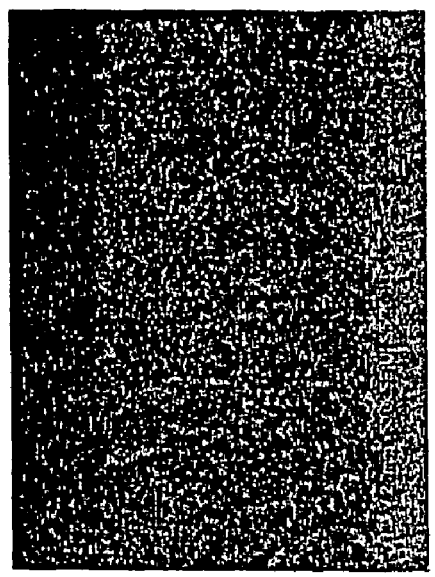
Figure 14A:
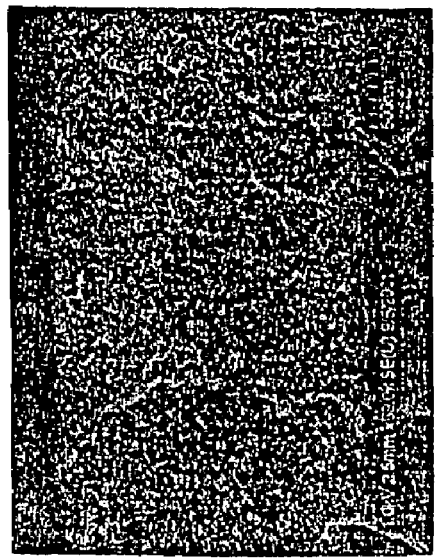
Figure 14C:
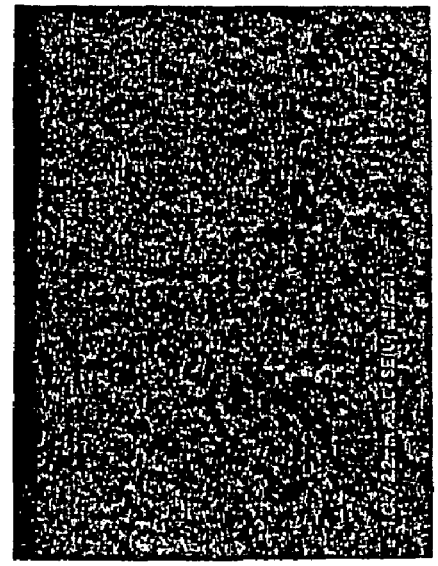

Shown in FIGS. 14A-D14D are FE-SEM's of porous polyarylenes generated with various stoichiometries ranging from 1:1 to 1:0.7 all having 25% TRIS 2 and 30% wt. polystyrene (PS) nanoparticles. Specifically, FIG. 14A is the FE-SEM of Matrix 1:1; FIG. 14B is the FE-SEM for Matrix 0.9; FIG. 14C is the FE-SEM for Matrix 0.8; and FIG. 14D is the FE-SEM for Matrix 0.7. From these micrographs, it is clear that smaller pores are obtained as the acetylene content is increased. The refractive indices (RIs) and dielectric constant (k) are essentially the same. Specifically, for the polyarylene composition shown in FIG. 14A, the RI is 1.46 and k is 2.15; for the polyarylene composition shown in FIG. 14B, the RI is 1.49; for the polyarylene composition shown in FIG. 14C, the RI is 1.46 and the k is 2.13; and for the polyarylene composition shown in FIG. 14D, the RI is 1.49.

In summary, this example demonstrates that higher crosslink density has a pronounced affect on the morphology and foaming efficiency. Increasing the crosslink density to the same extent by either stoichiometry offset or through addition of TRIS 2 is dramatically different, where TRIS 2 addition leads to smaller pores.

While the present invention has been particularly shown and described with respect to preferred embodiments thereof, it will be understood by those skilled in the art that the foregoing and other changes in forms and details made be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by the Letters Patent is:

1. A composition of matter having a vitrification temperature (Tv-comp) comprising:
   a b-staged thermosetting resin comprising a polyarylene material having a vitrification temperature (Tv-resin);
   a pore generating material comprising a thermally labile polymer material; and
   a reactive additive that comprises a triacetylene material that includes a centrally located uniformly 1,3,5-trisubstituted phenyl moiety, and lowers the Tv-comp below that of the Tv-resin, said reactive additive is selected to increase compatibility of the pore generating material and the b-staged thermosetting resin.

2. The composition of matter of claim 1 wherein said resin comprises functionality that is reactive with said reactive additive.

3. The composition of matter of claim 1 wherein said pore generating material is functionally attached to said resin.

4. The composition of matter of claim 1 wherein said pore generating material is substantially dispersed within said resin.

5. The composition of matter of claim 1 wherein said reactive additive comprises functionality that becomes chemically incorporated into said resin upon vitrification producing a structure that has sufficient mechanical strength to withstand capillary collapsing forces produced upon decomposition of said pore generating material.

6. The composition of matter of claim 1 wherein said pore generating material is polystyrene nanoparticles.

7. The composition of matter of claim 1 wherein said reactive additive plasticizes said resin thereby lowering the glass transition temperature of said composition and allowing vitrification to proceed at lower temperatures.

8. The composition of matter of claim 1 wherein said reactive additive allows, during curing of said composition of matter, the glass transition of said composition of matter to advance above the curing temperature.

9. The composition of matter claim 1 wherein said reactive additive is selected from the group consisting of

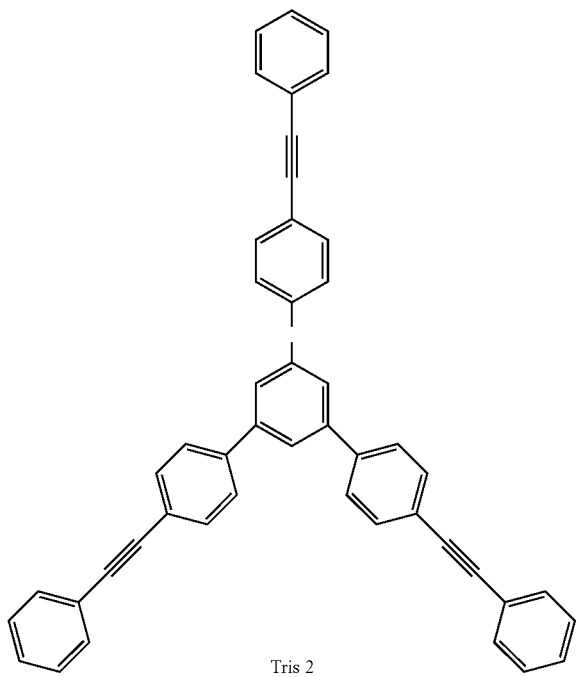

Tris 2

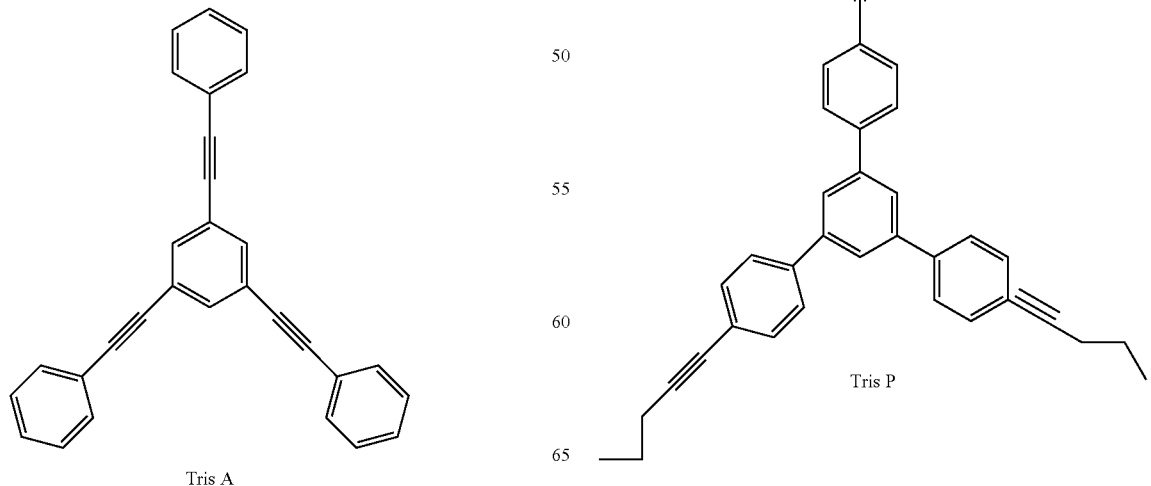

Tris A

Tris P

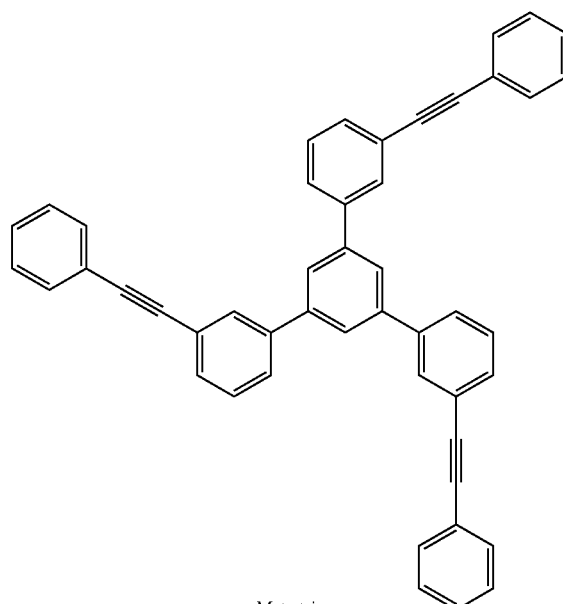

Meta tris

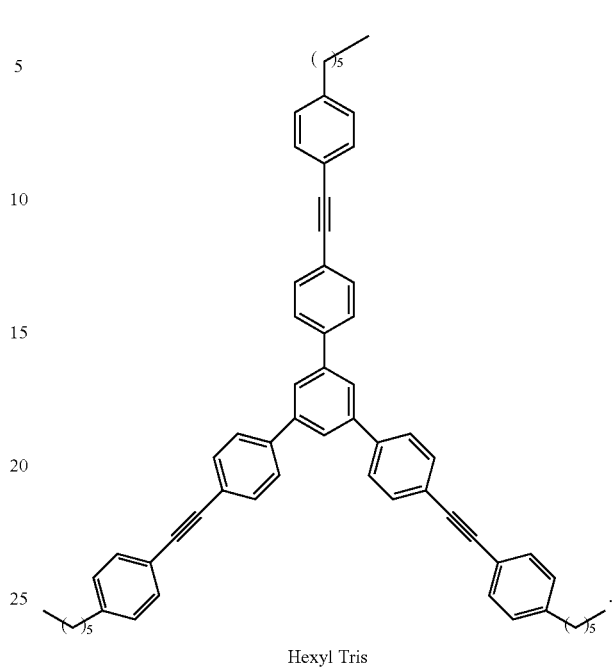

Hexyl Tris

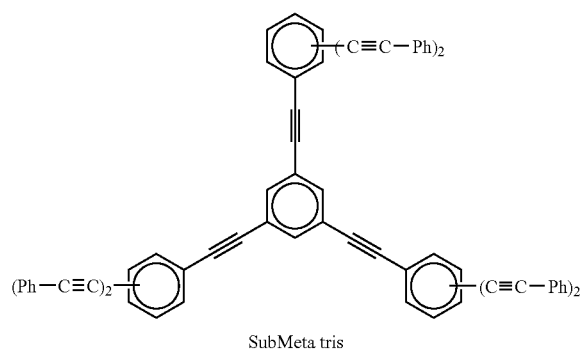

SubMeta tris

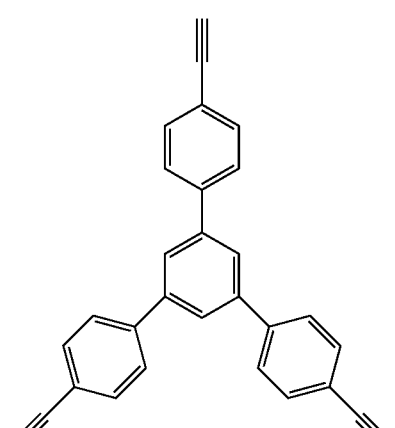

Tris E

10. The composition of matter of claim 9 wherein said reactive additive is TRIS A, TRIS 2 or TRIS P.

11. The composition of matter of claim 1 wherein said b-staged thermosetting resin is a Diels Alder reaction product between a polyfunctional cyclopentadienone and a poly functional acetylene.

12. The composition of matter of claim 1 further comprising a solvent.

13. The composition of matter of claim 1 comprising from about 20 to about 91 wt. % of said b-staged thermosetting resin, from about 5 to about 50 wt. % of said pore generating material; and from about 4 to about 60 wt. % of said reactive additive, based on 100 percent dry weight of the total composition.

14. The composition of matter of claim 1 wherein said reactive additive is selected to increase the foaming efficiency for a nucleation and growth process or a particle template process as compared to a composition not including the reactive additive.

15. The composition of matter of claim 1 wherein said b-staged thermosetting resin comprises cyclopentadienone functional compounds and acetylene functional aromatic compounds and/or partially polymerized reaction products of said compounds.

16. The composition of matter of claim 1 wherein said reactive additive is selected so as to increase the crosslinking density of the resin as compared to a composition not including the reactive additive.

17. The composition of matter of claim 1 wherein the reactive additive serves as a compatiblizer between the b-staged thermosetting resin and the pore generating material causing phase separation to be delayed in nucleation and growth systems, while preventing agglomeration in a particle template approach.

18. The composition of matter of claim 1 wherein vitrification occurs below the pore generating material's thermal decomposition temperature.

19. A composition of matter having a vitrification temperature (Tv-comp) comprising:

a b-staged thermosetting resin comprising a polyarylene resin, and having a vitrification temperature (Tv-resin);

a pore generating material that comprises a thermally labile polymer material; and a reactive additive that comprises a triacetylene material that includes a centrally located uniformly 1,3,5-trisubstituted phenyl moiety, and lowers the Tv-comp below that of the Tv-resin.

20. The composition of matter of claim 19 wherein said resin comprises functionality that is reactive with said reactive additive.

21. The composition of matter of claim 19 wherein said reactive additive comprises functionality that becomes chemically incorporated into said resin upon vitrification producing a structure that has sufficient mechanical strength to withstand capillary collapsing forces produced upon decomposition of said pore generating material.

22. The composition of matter of claim 19 wherein said reactive additive plasticizes said resin thereby lowering the glass transition temperature of said composition and allowing vitrification to proceed at lower temperatures.

23. The composition of matter of claim 19 wherein said reactive additive allows, during curing of said composition of matter, the glass transition of said composition of matter to advance above the curing temperature.

24. The composition of matter of claim 19 wherein said reactive additive is selected from the group consisting of

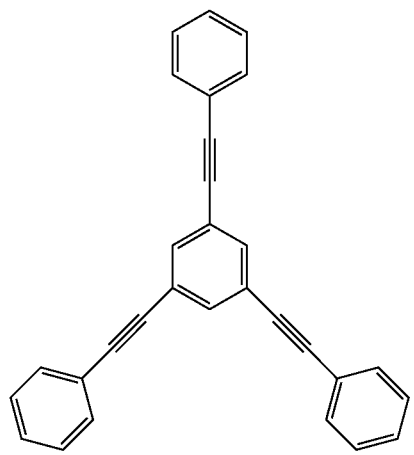

Tris A

-continued

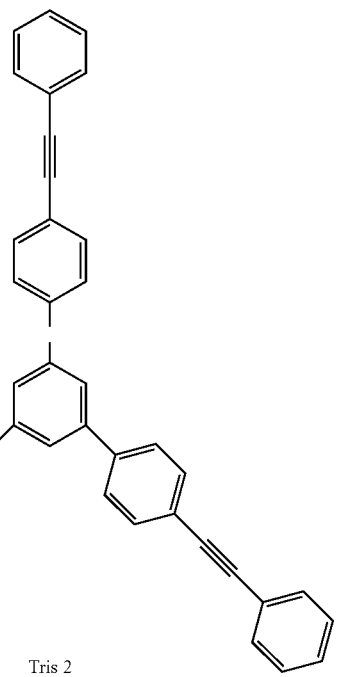

Tris 2

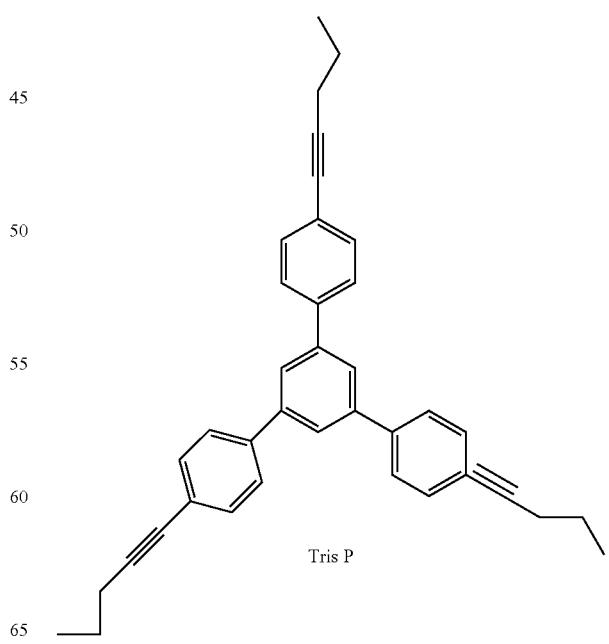

Tris P

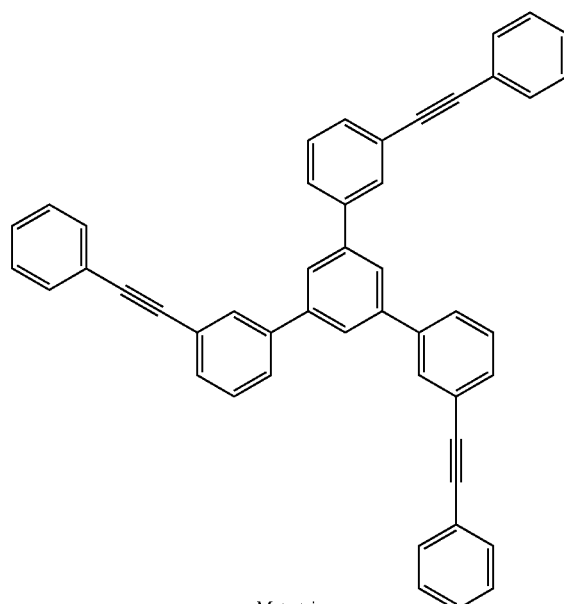

Meta tris

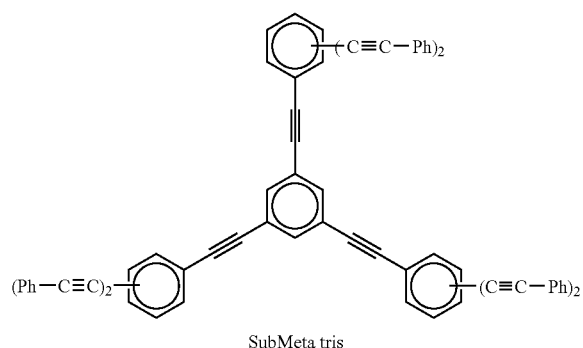

SubMeta tris

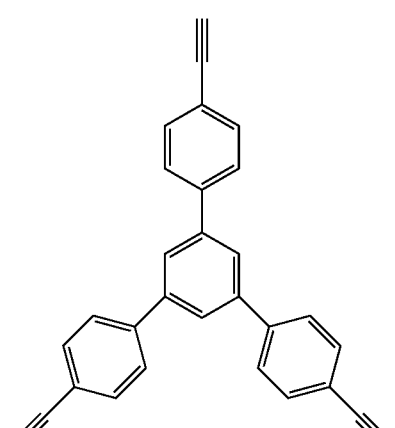

Tris E

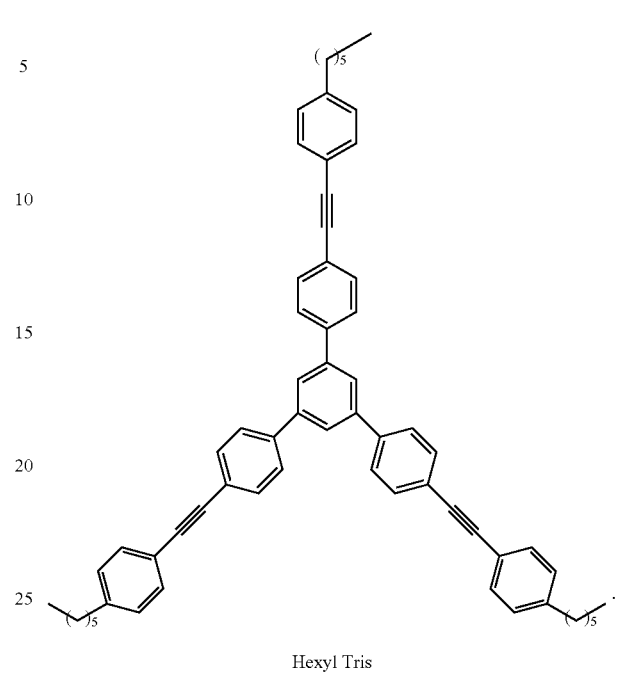

Hexyl Tris

25. A composition of matter having a vitrification temperature (Tv-comp) comprising:
   a b-staged thermosetting resin comprising a polyarylene material having a vitrification temperature (Tv-resin);
   a pore generating material comprising a thermally labile polymer material; and
   a reactive additive that comprises a triacetylene material that includes a centrally located uniformly 1,3,5-trisubstituted phenyl moiety, and is selected to increase compatibility of the pore generating material and the b-staged thermosetting resin.

26. The composition of matter of claim 25 wherein said resin comprises functionality that is reactive with said reactive additive.

27. The composition of matter of claim 25 wherein said reactive additive comprises functionality tat becomes chemically incorporated into said resin upon vitrification producing a structure that has sufficient mechanical strength to withstand capillary collapsing forces produced upon decomposition of said pore generating material.

28. The composition of matter of claim 25 wherein said reactive additive plasticizes said resin thereby lowering the glass transition temperature of said composition and allowing vitrification to proceed at lower temperatures.

29. The composition of matter of claim 25 wherein said reactive additive allows, during curing of said composition of matter, the glass transition of said composition of matter to advance above the curing temperature.

30. The composition of matter of claim 25 wherein said reactive additive is selected from the group consisting of

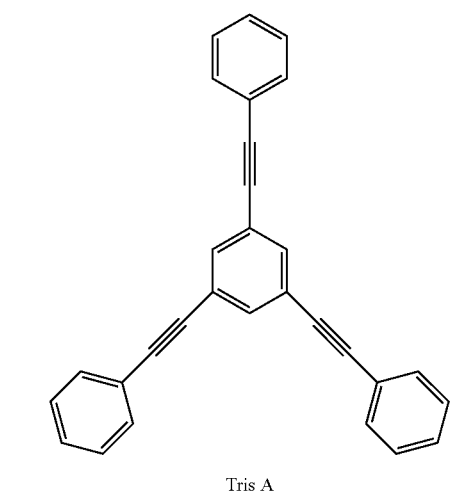
Tris A
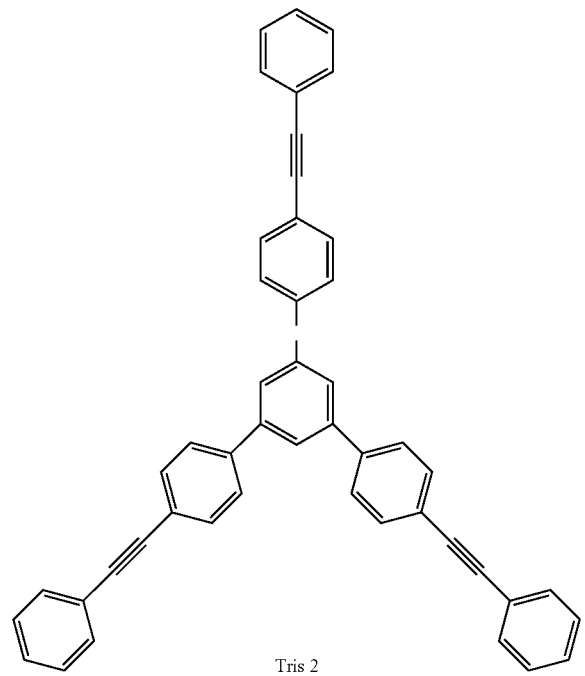
Tris 2
-continued
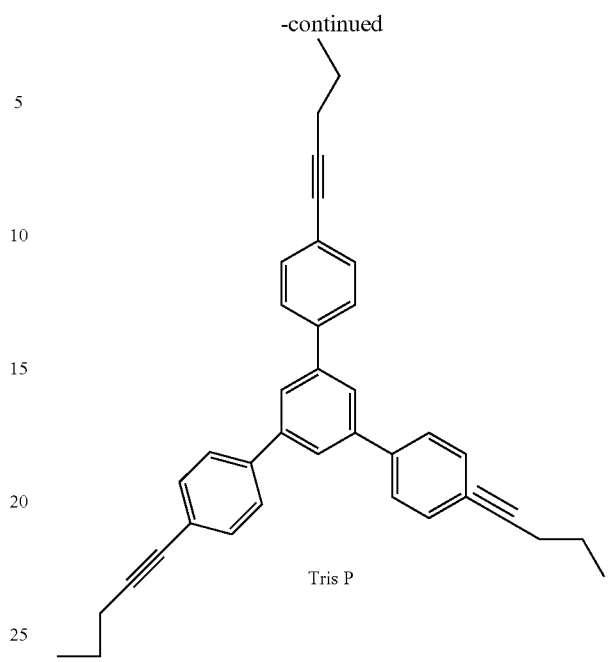
Tris P
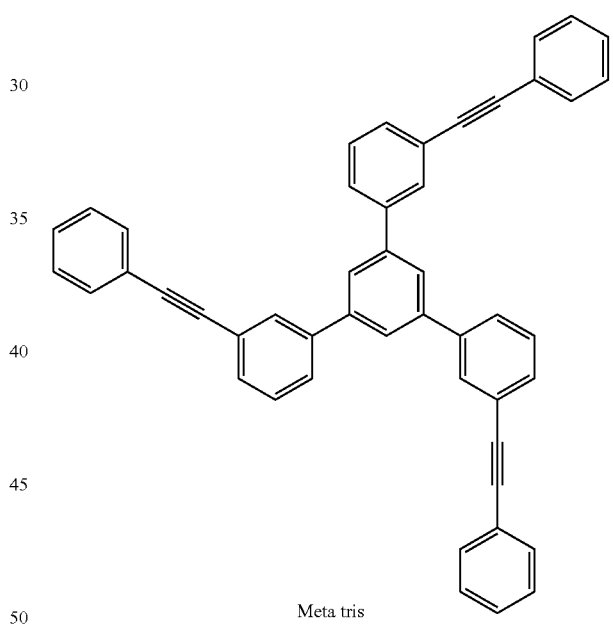
Meta tris
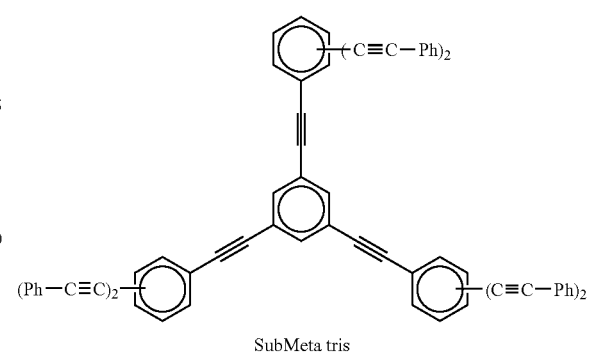
SubMeta tris

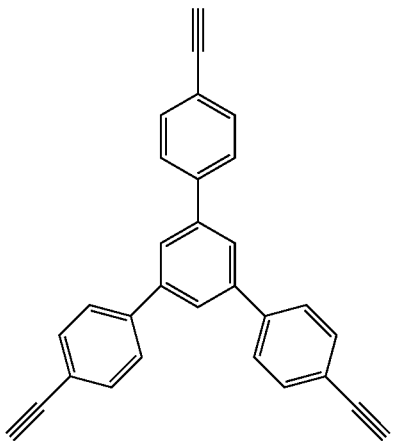
Tris E
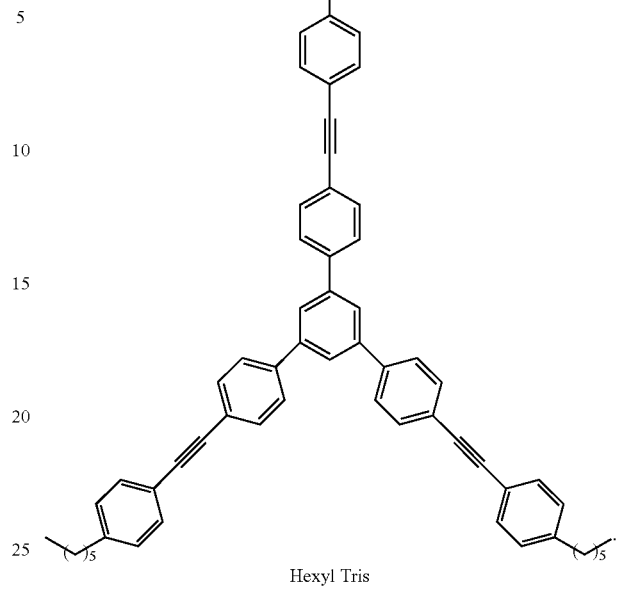
Hexyl Tris
* * * * *